United States Patent
Hardy et al.

(10) Patent No.: US 12,091,049 B2
(45) Date of Patent: Sep. 17, 2024

(54) METHODS AND SYSTEMS FOR AUTOMATIC PROBLEMATIC MANEUVER DETECTION AND ADAPTED MOTION PLANNING

(71) Applicant: Waymo LLC, Mountain View, CA (US)

(72) Inventors: Jason Hardy, Mountain View, CA (US); Xinfeng Le, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 290 days.

(21) Appl. No.: 17/650,542

(22) Filed: Feb. 10, 2022

(65) Prior Publication Data
US 2023/0249711 A1     Aug. 10, 2023

(51) Int. Cl.
*B60W 60/00*     (2020.01)
*G01C 21/34*     (2006.01)
*G06F 30/20*     (2020.01)

(52) U.S. Cl.
CPC ..... *B60W 60/0015* (2020.02); *G01C 21/3461* (2013.01); *G06F 30/20* (2020.01);
(Continued)

(58) Field of Classification Search
None
See application file for complete search history.

(56) References Cited

U.S. PATENT DOCUMENTS 10,678,248 B2   6/2020  Ford
11,135,881 B2 * 10/2021 Hall ............... B60W 30/02
(Continued)

FOREIGN PATENT DOCUMENTS

EP    3335006 B1    10/2019
WO    2020139327 A1  7/2020

OTHER PUBLICATIONS

Li et al., "Optimization-Based Maneuver Planning for a Tractor-Trailer Vehicle in a Curvy Tunnel: A Weak Reliance on Sampling and Search", IEEE Robotics and Automation Letters, 7(2):706-713 (2022).

*Primary Examiner* — Christian Chace
*Assistant Examiner* — Shayne M. Gilbertson
(74) *Attorney, Agent, or Firm* — McDonnell Boehnen Hulbert & Berghoff LLP

(57) ABSTRACT

Example embodiments relate to methods and systems for automatic problematic maneuver detection and adapted motion planning. A computing device may obtain a route for navigation by a vehicle and a set of vehicle parameters corresponding to the vehicle. Each vehicle parameter can represent a physical attribute of the vehicle. The computing device may generate a virtual vehicle that represents the vehicle based on the set of vehicle parameters and perform a simulation that involves the virtual vehicle navigating the route. Based on the results of the simulation, the computing device may provide the original route or a modified route to the vehicle for the vehicle to subsequently navigate to its destination. In some cases, the simulation may further factor additional conditions, such as potential weather and traffic conditions that are likely to occur during the time when the vehicle plans on navigating the route.

20 Claims, 15 Drawing Sheets

(52) U.S. Cl.
CPC .............. *B60W 2300/145* (2013.01); *B60W 2530/201* (2020.02); *B60W 2554/00* (2020.02); *B60W 2555/20* (2020.02); *B60W 2556/40* (2020.02)

(56) References Cited

U.S. PATENT DOCUMENTS

| | | | |
|---|---|---|---|
| 11,433,885 B1* | 9/2022 | Beller | B60W 30/095 |
| 2019/0243372 A1* | 8/2019 | Huval | G05D 1/0221 |
| 2021/0041255 A1 | 2/2021 | Schein | |
| 2021/0080961 A1 | 3/2021 | Shenai | |
| 2021/0110715 A1 | 4/2021 | Sherony | |
| 2021/0132615 A1* | 5/2021 | Passot | G05D 1/0217 |
| 2021/0148726 A1 | 5/2021 | Ostafew | |
| 2021/0348933 A1 | 11/2021 | Abrams | |
| 2022/0252413 A1* | 8/2022 | Mezaael | G06Q 10/0635 |
| 2022/0340160 A1* | 10/2022 | Nayhouse | B60W 60/001 |

* cited by examiner

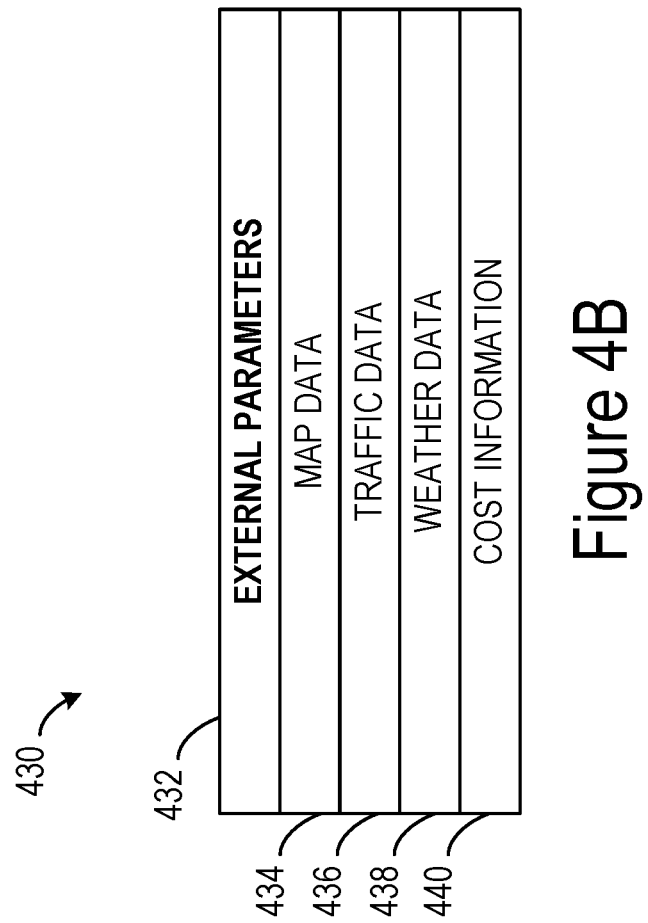

METHODS AND SYSTEMS FOR AUTOMATIC PROBLEMATIC MANEUVER DETECTION AND ADAPTED MOTION PLANNING

BACKGROUND

Advancements in computing, sensors, and other technologies have enabled vehicles to safely navigate between locations autonomously, i.e., without requiring input from a human driver. By processing sensor measurements of the surrounding environment in near real-time, an autonomous vehicle can safely transport passengers or objects (e.g., cargo) between locations while avoiding obstacles, obeying traffic requirements, and performing other actions that are typically conducted by the driver. Shifting both decision-making and control of the vehicle over to vehicle systems can allow the vehicle's passengers to devote their attention to tasks other than driving.

SUMMARY

Example embodiments relate to techniques for automatic problematic maneuver detection and adapted motion planning. Such techniques may be performed by a computing device to design a route through simulations that enables a vehicle to efficiently autonomously navigate to a destination. The simulations can be customized based on parameters specific to the vehicle and conditions that the vehicle may likely encounter during navigation.

Accordingly, a first example embodiment describes a method. The method involves obtaining, at a computing device, a route for navigation by a vehicle and a set of vehicle parameters corresponding to the vehicle. Each vehicle parameter represents a physical attribute of the vehicle. The method further involves generating a virtual vehicle that represents the vehicle based on the set of vehicle parameters and performing, by the computing device, a simulation that involves the virtual vehicle navigating the route. The method also involves providing, by the computing device, route instructions to the vehicle based on performing the simulation. The vehicle is configured to autonomously navigate according to the route instructions.

Another example embodiment describes a system. The system includes a vehicle and a computing device. The computing device is configured to obtain a route for navigation by a vehicle and a set of vehicle parameters corresponding to the vehicle. Each vehicle parameter represents a physical attribute of the vehicle. The computing device is further configured to generate a virtual vehicle that represents the vehicle based on the set of vehicle parameters and perform a simulation that involves the virtual vehicle navigating the route. The computing device is also configured to provide route instructions to the vehicle based on performing the simulation. The vehicle is configured to autonomously navigate according to the route instructions.

An additional example embodiment describes a non-transitory computer-readable medium configured to store instructions, that when executed by a computing device, causes the computing device to perform operations. The operations involve obtaining a route for navigation by a vehicle and a set of vehicle parameters corresponding to the vehicle. Each vehicle parameter represents a physical attribute of the vehicle. The operations also involve generating a virtual vehicle that represents the vehicle based on the set of vehicle parameters, performing a simulation that involves the virtual vehicle navigating the route, and providing route instructions to the vehicle based on performing the simulation. The vehicle is configured to autonomously navigate according to the route instructions.

The foregoing summary is illustrative only and is not intended to be in any way limiting. In addition to the illustrative aspects, embodiments, and features described above, further aspects, embodiments, and features will become apparent by reference to the figures and the following detailed description.

BRIEF DESCRIPTION OF THE FIGURES

FIG. 4B is a table of external parameters that can be used during route simulations, according to one or more example embodiments.

DETAILED DESCRIPTION

Figure 1:
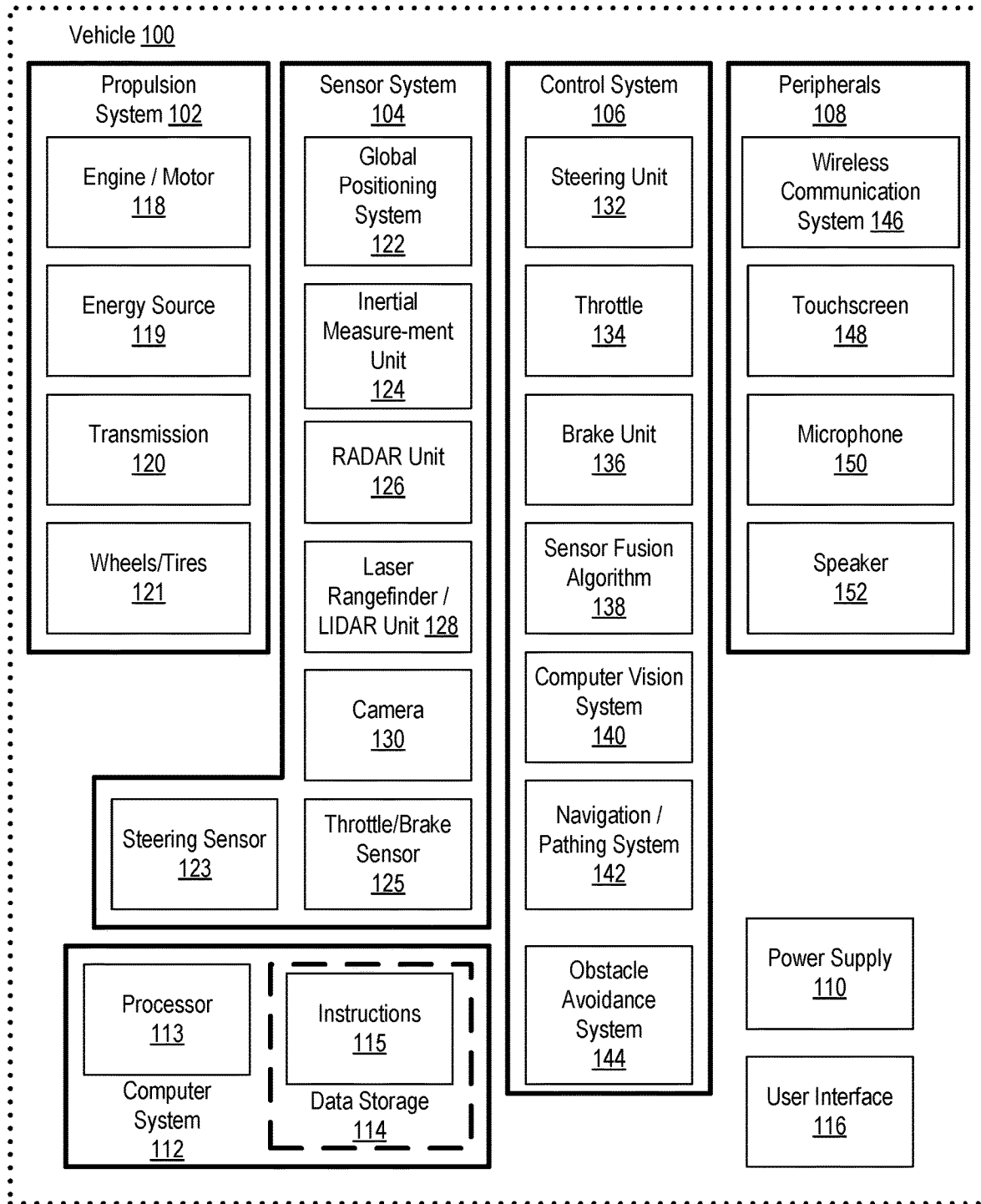
FIG. 1 is a functional block diagram illustrating a vehicle, according to one or more example embodiments.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Vehicle navigation can require vehicles to perform difficult maneuvers in some situations. For instance, some routes for vehicle travel might include tight turns, navigation under low bridges, navigation through construction zones, crossing train tracks, navigation along congested roadways, and/or narrow roadways, among other possibilities. A driver is typically able to determine whether a particular maneuver is feasible when driving the vehicle and control the vehicle accordingly. For example, professional semi-truck drivers often rely on experience and familiarity of their vehicle when deciding whether to attempt a particular maneuver during vehicle navigation or to alter the vehicle's current path to avoid the maneuver. In particular, semi-trucks and other types of vehicles pulling trailers may be especially difficult to navigate through certain maneuvers where there is limited space and/or other potential constraints that smaller vehicles can avoid or successfully navigate.

In addition, a driver can also decide as to whether or not it is appropriate and reasonable to bend the typical rules of the road to complete a specific maneuver. For instance, when executing a tight turn, the driver may turn such that the vehicle briefly crosses into another open lane outside of the vehicle's current lane. Vehicles that are configured to navigate routes autonomously or semi-autonomously, however, might not be able to rely upon the skills of a driver upon encountering a complex maneuver during navigation of a route.

Example embodiments presented herein involve techniques for automatic problematic maneuver detection and adapted motion planning. Such techniques can be used for automated route planning that can enable autonomous and semi-autonomous vehicles to efficiently reach target destinations in a timely manner via routes that avoid potential navigation maneuvers that may cause issues for the vehicle traveling the route. A computing device can perform disclosed techniques to assist various types of vehicles plan and navigate routes, including passenger vehicles and semi-trucks. In particular, the computing device can optimize the route for a vehicle through using one or more simulations based on a variety of parameters that can depend on the vehicle and/or potential route conditions, such as vehicle parameters, total time required to reach destination, weather and traffic conditions during planned travel time, fuel and/or energy costs, road types, and tollways, among others.

By way of an example, a computing device may initially receive information that can be used to plan a route for a vehicle. For instance, the information can be received from vehicle systems, another computing system, and/or input from an operator or a passenger. In some instances, the information may indicate a current location of the vehicle and one or more destinations that the vehicle is configured to navigate to. In addition, the information can also specify a time or range of times that the vehicle plans to navigate to the destination and other potential parameters that the computing device may use.

The computing device can also receive and/or access information that describes aspects of the vehicle, also referred herein as vehicle parameters. Some example vehicle parameters may indicate the type of vehicle (e.g., passenger or semi-truck), the make and model of the vehicle, height, length, width, and/or weight of the vehicle. In addition, vehicle parameters can also indicate the configuration of the vehicle (e.g., lifted, quantity of wheels), the age of the vehicle, the type and quantity of tires on the vehicle, type of motor (e.g., electric and/or internal combustion), and/or power rating of the motor. In some instances, the information may indicate that the vehicle is configured to pull a trailer when navigating to the destination. As such, additional vehicle parameters may also be obtained that describe aspects of the trailer, such as the height, length, width, and weight of the trailer.

In some examples, the information can be based on the combination of the vehicle while pulling the trailer. For instance, the total weight, maximum height, and center of gravity can be represented by vehicle parameters. Vehicle parameters can be provided via the vehicle and/or from another source, such as a database that stores information representing the vehicle. The parameters can be determined and updated by technicians during analysis, via measurement tools (e.g., a scale) and/or based on previous routes performed by the vehicle. In some instances, parameters can be based on the manufacturing of the vehicle.

The computing device can use the information to determine a route for the vehicle to navigate from its current location to the destination. In particular, the computing device may use simulations to test potential route options and identify a route for the vehicle to use. The identified route may depend on the success rate of the simulations along with other potential factors, such as time and cost constraints associated with navigating the potential routes. For instance, when two routes appear to both enable the vehicle to successfully reach its destination, the identified route can be the route that minimizes the total trip time and/or avoids toll roads or certain travel conditions (e.g., difficult traffic or weather conditions).

The simulations may aim to replicate real-world conditions and can involve using a virtual vehicle modeled on the vehicle parameters describing the vehicle. The computing device can simulate the virtual vehicle navigating one or more potential routes across a range of conditions that the vehicle may encounter in the real-world. This way, the simulations can test whether the specific abilities of the vehicle can perform the different maneuvers associated with route options that can enable the vehicle to navigate from its current location to the destination in the real world. As such, the simulations can involve using map data that indicate speed limits, road positions and boundaries, and other information that can impact navigation of the vehicle in the real-world, such as weather data and traffic conditions data. By using this information, the simulations can increase how accurate the simulation results apply to the vehicle. The map data and other external parameter data can be obtained from a database and/or vehicles that recently traversed the roads associated with the potential routes. This way, construction and other potential changes (e.g., a malfunctioning traffic light or accident between vehicles) can be factored during the simulations to determine a route for the vehicle to use.

As an example, when the vehicle is a semi-truck, the virtual vehicle used within the simulations may have parameters that mirror the parameters of the semi-truck, including the configuration of the semi-truck (e.g., height, length, width, and weight) and abilities associated with that type of semi-truck (e.g., turning radius, motor type). By using simulations that depend on the real-world semi-truck and road options available, the computing device can test different route options to find a specific route suitable for the semi-truck to perform.

In some cases, route simulations may indicate that a particular maneuver or roadway is unsuitable for navigation by the vehicle. For instance, the virtual vehicle may indicate that the real-world vehicle is too tall to go under a particular bridge or that a particular turn is too tight for the vehicle to complete. By using multiple simulations, the computing device can modify route options efficiently and identify a path that the real-world vehicle may be able to complete. For instance, each simulation may involve testing a variation of the prior simulated route with one or more adjusted aspects (e.g., a different turn or road) until the computing device identifies a route that the virtual vehicle performs above a threshold success level.

By way of an example, a vehicle might have a particular route for navigation to a destination. A computing device in connection with the vehicle (e.g., onboard the vehicle or wirelessly communicating with the vehicle) may then perform one or more simulations of a virtual vehicle navigating the first route in a digital environment that aims to mimic probable real-world conditions, where the virtual vehicle mirrors the actual vehicle based on inputted and/or collected parameters. For instance, the computing device can simulate the route prior to the vehicle initiating the particular route or while the vehicle navigates in real-time. The simulations may test the route according to dynamic environment parameters and can indicate when the virtual vehicle unsuccessfully completes navigation along the particular route for one or more reasons, such as a tight turn, a steep inclined road, and/or a low bridge impeding the vehicle's clearance, among other potential reasons. The computing device could then use the simulations to generate an alternative route that can be completed by the real-world vehicle as shown by the success of the virtual vehicle within the simulations. This process can be performed iteratively by the computing device until the simulations output a route that would enable the vehicle to effectively navigate to its destination above a threshold performance level. The vehicle could then autonomously, or semi-autonomously, navigate the alternative route according to the route instructions provided by the computing device.

Further, in some examples, the computing device might simulate the virtual vehicle navigating according to any set number of routes (e.g., dozens, hundreds, thousands of routes) using parallel simulations that can test different roadways that enable the vehicle to reach its destination. After running all of the set number of route simulations, the computing device might select the route that the virtual vehicle performed the best for routing instructions. For instance, the computing device might assign a score to each route indicating the level of success of the virtual vehicle navigating the route based on the various simulations. The computing device might then be able to compare the scores of all of the routes and create route instructions based on the highest scoring route, which can be determined based on a variety of factors including time required to reach the destination, availability of charging stations or refueling stations, types of roads used, etc.

In some examples, there may be a threshold score included that is a minimum base score to provide route instructions based on that route. In such scenarios, if none of the set number of route simulations outputs a score above the threshold level, the computing device may run a second set of route simulations differing from the first set of route simulations. This continuous search for an optimized route through simulations can be continued by the computing device until simulations identify a route that outputs a score higher than the threshold score. In some examples, if more than one route in the set of routes receive an output score higher than the threshold score, the computing device can present the routes to one or more passengers of the vehicle and allow the one or more passengers to choose the route of navigation. This can enable passengers to influence the route traveled when comparable routes are available for the vehicle to reach the destination. Based on the one or more passengers input, the computing device might generate route instructions for the vehicle to navigate along the selected route and send those to the vehicle.

In some examples, simulations may be performed using map data and other potential information, such as predicted traffic and weather conditions that are likely to occur when the vehicle is set to navigate to the destination. In some cases, the vehicle may be prepared to initiate navigation immediately after receiving the route from the computing device. As such, the computing device may obtain traffic information and/or weather information from other sources (e.g., servers) that can be used to further enhance the simulations. In some examples, the computing device may obtain traffic and weather conditions from vehicles currently traveling in areas along potential routes that the vehicle may use.

In some implementations, the computing device determining the route for the vehicle may be located remotely from the vehicle. For instance, the computing device can be a fleet-management system that provides routes for multiple vehicles and can be specialized to perform compute intensive simulations. In other examples, the computing device can be located onboard the vehicle and may also provide control instructions to vehicle systems based on the simulation. In further examples, vehicle systems may communicate with one or more remote computing devices to perform operations disclosed herein. In addition, in some examples, the computing device may iteratively perform route optimization using disclosed techniques. For instance, as the position of the vehicle changes, the dynamic environment between the vehicle and its destination can change. By iteratively performing techniques disclosed herein, the computing device can update the route as the vehicle navigates by factoring potential changes, such as accidents or changes in weather or traffic that can impact navigation.

In some examples, an automatic problematic maneuver detection system is disclosed that can enable vehicles to autonomously operate confidently during navigation. The system may be configured to receive information from a vehicle, such as a route for navigation by the vehicle and vehicle parameters about the vehicle, including its height, weight, and length. In some cases, the computing device may identify a portion or portions of the received route that requires the vehicle to execute a difficult maneuver, and before directing the vehicle that way, perform a simulation that involves a virtual vehicle navigating the difficult maneuver, optionally taking into account parameters such as the speed range and road boundaries available for the vehicle. Based on the simulation, the system may determine whether or not the virtual vehicle was able to successfully complete the difficult maneuver and provide feedback to the vehicle about whether or not the vehicle should use that route in navigation. The simulation could also be utilized to identify a portion of a route that requires a difficult maneuver that the autonomous vehicle could not successfully navigate (or performed below a threshold confidence level) and update the navigation route of the vehicle to not include this portion. This unnavigable portion of the route could be stored in memory and configured to not allow use of that portion in subsequent route requests for the same autonomous vehicle.

In some embodiments, computing devices may operate as an adapted motion planner, which can be utilized to allow safe navigation of a vehicle or multiple vehicles during navigation. The computing device may be configured to identify potential maneuvers as a vehicle navigates and and determine when to adjust control instructions outside general allowable navigation rules of these vehicles in order to allow for operation of previously-infeasible maneuvers without increasing mission risk or compromising safety. For instance, the computing device may extend the area used by the vehicle during certain maneuvers beyond the existing boundaries of the allowable operating conditions of the vehicle, such as utilizing a neighboring lane for a limited amount of time during a tight turn. To enable the autonomous driving system to utilize the neighboring lane, the computing device may temporarily adapt previously-allowable operating constraints on the vehicle to allow the vehicle to use additional space during a maneuver. As an example result, the computing device may expand the boundaries during execution of the maneuver. After successful completion of the maneuver, the computing device may then resume navigation according to original single-lane type operating conditions.

In further examples, a computing device may simulate potential routes for a vehicle to identify a route that meets a set of qualifying conditions, such as time of arrival, ability for the vehicle to maneuver all portions of the route, and avoidance of traffic, among other factors. The computing device may then display the identified route on map data or in another visual format that can enable a human operator (e.g., a remote operator, a passenger on the vehicle) to review, confirm, reject, and/or modify the route. Based on inputs from the human operator, the computing device may then update the route and provide the updated route to the vehicle. In some instances, the computing device may further utilize constraints that limit the human operator from selecting certain roads or otherwise modifying the route in a way that the simulations determined to be difficult for the vehicle to complete. For example, the constraints may prevent the human operator from being able to select a residential road that is off limits to the vehicle based on the weight and size of the vehicle. In another example, the constraints may prevent the human operator from being able to select a path that the vehicle could not maneuver due to some physical limitation, such as a low overpass.

In further examples, vehicle systems can adjust operation mode during navigation to temporarily enable a vehicle to perform difficult maneuvers. For instance, systems enabling semi-autonomous or fully autonomous navigation by a semi-truck or another large vehicle may temporarily switch to a secondary mode of operation that allows the vehicle to complete difficult tight turns or other maneuvers. The secondary mode of operation can permit vehicle systems to use sensor data to detect additional space positioned next to the lane of travel currently occupied by the vehicle and enable vehicle systems to allow portions of the vehicle (or trailer) to temporarily navigate into the additional space during performance of a maneuver. For example, vehicle systems may detect that additional space is available during the performance of a tight right turn and subsequently control the vehicle to make a slightly wider turn that extends into the additional space enabling the turn to be completed in real-time. The vehicle systems can monitor for other vehicles and obstacles to avoid potential collisions during performance of difficult maneuvers.

Referring now to the figures, FIG. 1 is a functional block diagram illustrating example vehicle 100, which may be configured to operate fully or partially in an autonomous mode. More specifically, vehicle 100 may operate in an autonomous mode without human interaction (or reduced human interaction) through receiving control instructions from a computing system (e.g., a vehicle control system). As part of operating in the autonomous mode, vehicle 100 may use sensors to detect and possibly identify objects of the surrounding environment in order to enable safe navigation. In some implementations, vehicle 100 may also include subsystems that enable a driver (or a remote operator) to control operations of vehicle 100.

As shown in FIG. 1, vehicle 100 includes various subsystems, such as propulsion system 102, sensor system 104, control system 106, one or more peripherals 108, power supply 110, computer system 112, data storage 114, and user interface 116. In other examples, vehicle 100 may include more or fewer subsystems. The subsystems and components of vehicle 100 may be interconnected in various ways (e.g., wired or wireless connections). In addition, functions of vehicle 100 described herein can be divided into additional functional or physical components, or combined into fewer functional or physical components within implementations.

Propulsion system 102 may include one or more components operable to provide powered motion for vehicle 100 and can include an engine/motor 118, an energy source 119, a transmission 120, and wheels/tires 121, among other possible components. For example, engine/motor 118 may be configured to convert energy source 119 into mechanical energy and can correspond to one or a combination of an internal combustion engine, an electric motor, steam engine, or Sterling engine, among other possible options. For instance, in some implementations, propulsion system 102 may include multiple types of engines and/or motors, such as a gasoline engine and an electric motor.

Energy source 119 represents a source of energy that may, in full or in part, power one or more systems of vehicle 100 (e.g., engine/motor 118). For instance, energy source 119 can correspond to gasoline, diesel, other petroleum-based fuels, propane, other compressed gas-based fuels, ethanol, solar panels, batteries, and/or other sources of electrical power. In some implementations, energy source 119 may include a combination of fuel tanks, batteries, capacitors, and/or flywheels.

Transmission 120 may transmit mechanical power from engine/motor 118 to wheels/tires 121 and/or other possible systems of vehicle 100. As such, transmission 120 may include a gearbox, a clutch, a differential, and a drive shaft, among other possible components. A drive shaft may include axles that connect to one or more wheels/tires 121.

Wheels/tires 121 of vehicle 100 may have various configurations within example implementations. For instance, vehicle 100 may exist in a unicycle, bicycle/motorcycle, tricycle, or car/truck four-wheel format, among other possible configurations. As such, wheels/tires 121 may connect to vehicle 100 in various ways and can exist in different materials, such as metal and rubber.

Sensor system 104 can include various types of sensors, such as Global Positioning System (GPS) 122, inertial measurement unit (IMU) 124, radar unit 126, laser rangefinder/lidar unit 128, camera 130, steering sensor 123, and throttle/brake sensor 125, among other possible sensors. In some implementations, sensor system 104 may also include sensors configured to monitor internal systems of the vehicle 100 (e.g., $O_2$ monitors, fuel gauge, engine oil temperature, condition of brakes).

GPS 122 may include a transceiver operable to provide information regarding the position of vehicle 100 with respect to the Earth. IMU 124 may have a configuration that uses one or more accelerometers and/or gyroscopes and may sense position and orientation changes of vehicle 100 based on inertial acceleration. For example, IMU 124 may detect a pitch and yaw of the vehicle 100 while vehicle 100 is stationary or in motion.

Radar unit 126 may represent one or more systems configured to use radio signals to sense objects, including the speed and heading of the objects, within the local environment of vehicle 100. As such, radar unit 126 may include antennas configured to transmit and receive radar signals as discussed above. In some implementations, radar unit 126 may correspond to a mountable radar system configured to obtain measurements of the surrounding environment of vehicle 100. For example, radar unit 126 can include one or more radar units configured to couple to the underbody of a vehicle.

Laser rangefinder/lidar 128 may include one or more laser sources, a laser scanner, and one or more detectors, among other system components, and may operate in a coherent mode (e.g., using heterodyne detection) or in an incoherent detection mode. Camera 130 may include one or more devices (e.g., still camera or video camera) configured to capture images of the environment of vehicle 100.

Steering sensor 123 may sense a steering angle of vehicle 100, which may involve measuring an angle of the steering wheel or measuring an electrical signal representative of the angle of the steering wheel. In some implementations, steering sensor 123 may measure an angle of the wheels of the vehicle 100, such as detecting an angle of the wheels with respect to a forward axis of the vehicle 100. Steering sensor 123 may also be configured to measure a combination (or a subset) of the angle of the steering wheel, electrical signal representing the angle of the steering wheel, and the angle of the wheels of vehicle 100.

Throttle/brake sensor 125 may detect the position of either the throttle position or brake position of vehicle 100. For instance, throttle/brake sensor 125 may measure the angle of both the gas pedal (throttle) and brake pedal or may measure an electrical signal that could represent, for instance, an angle of a gas pedal (throttle) and/or an angle of a brake pedal. Throttle/brake sensor 125 may also measure an angle of a throttle body of vehicle 100, which may include part of the physical mechanism that provides modulation of energy source 119 to engine/motor 118 (e.g., a butterfly valve or carburetor). Additionally, throttle/brake sensor 125 may measure a pressure of one or more brake pads on a rotor of vehicle 100 or a combination (or a subset) of the angle of the gas pedal (throttle) and brake pedal, electrical signal representing the angle of the gas pedal (throttle) and brake pedal, the angle of the throttle body, and the pressure that at least one brake pad is applying to a rotor of vehicle 100. In other embodiments, throttle/brake sensor 125 may be configured to measure a pressure applied to a pedal of the vehicle, such as a throttle or brake pedal.

Control system 106 may include components configured to assist in navigating vehicle 100, such as steering unit 132, throttle 134, brake unit 136, sensor fusion algorithm 138, computer vision system 140, navigation/pathing system 142, and obstacle avoidance system 144. More specifically, steering unit 132 may be operable to adjust the heading of vehicle 100, and throttle 134 may control the operating speed of engine/motor 118 to control the acceleration of vehicle 100. Brake unit 136 may decelerate vehicle 100, which may involve using friction to decelerate wheels/tires 121. In some implementations, brake unit 136 may convert kinetic energy of wheels/tires 121 to electric current for subsequent use by a system or systems of vehicle 100.

Sensor fusion algorithm 138 may include a Kalman filter, Bayesian network, or other algorithms that can process data from sensor system 104. In some implementations, sensor fusion algorithm 138 may provide assessments based on incoming sensor data, such as evaluations of individual objects and/or features, evaluations of a particular situation, and/or evaluations of potential impacts within a given situation.

Computer vision system 140 may include hardware and software operable to process and analyze images in an effort to determine objects, environmental objects (e.g., stop lights, road way boundaries, etc.), and obstacles. As such, computer vision system 140 may use object recognition, Structure from Motion (SFM), video tracking, and other algorithms used in computer vision, for instance, to recognize objects, map an environment, track objects, estimate the speed of objects, etc.

Navigation/pathing system 142 may determine a driving path for vehicle 100, which may involve dynamically adjusting navigation during operation. As such, navigation/pathing system 142 may use data from sensor fusion algorithm 138, GPS 122, and maps, among other sources to navigate vehicle 100. Obstacle avoidance system 144 may evaluate potential obstacles based on sensor data and cause systems of vehicle 100 to avoid or otherwise negotiate the potential obstacles.

As shown in FIG. 1, vehicle 100 may also include peripherals 108, such as wireless communication system 146, touchscreen 148, microphone 150, and/or speaker 152. Peripherals 108 may provide controls or other elements for a user to interact with user interface 116. For example, touchscreen 148 may provide information to users of vehicle 100. User interface 116 may also accept input from the user via touchscreen 148. Peripherals 108 may also enable vehicle 100 to communicate with devices, such as other vehicle devices.

Wireless communication system 146 may wirelessly communicate with one or more devices directly or via a communication network. For example, wireless communication system 146 could use 3G cellular communication, such as CDMA, EVDO, GSM/GPRS, or 4G cellular communications, such as WiMAX or LTE. Alternatively, wireless communication system 146 may communicate with a wireless local area network (WLAN) using WiFi or other possible connections. Wireless communication system 146 may also communicate directly with a device using an infrared link, Bluetooth, or ZigBee, for example. Other wireless protocols, such as various vehicular communication systems, are possible within the context of the disclosure. For example, wireless communication system 146 may include one or more dedicated short-range communications (DSRC) devices that could include public and/or private data communications between vehicles and/or roadside stations.

Vehicle 100 may include power supply 110 for powering components. Power supply 110 may include a rechargeable lithium-ion or lead-acid battery in some implementations. For instance, power supply 110 may include one or more batteries configured to provide electrical power. Vehicle 100 may also use other types of power supplies. In an example implementation, power supply 110 and energy source 119 may be integrated into a single energy source.

Vehicle 100 may also include computer system 112 to perform operations, such as operations described therein. As such, computer system 112 may include at least one processor 113 (which could include at least one microprocessor) operable to execute instructions 115 stored in a non-transitory computer readable medium, such as data storage 114. In some implementations, computer system 112 may represent a plurality of computing devices that may serve to control individual components or subsystems of vehicle 100 in a distributed fashion.

In some implementations, data storage 114 may contain instructions 115 (e.g., program logic) executable by processor 113 to execute various functions of vehicle 100, including those described above in connection with FIG. 1. Data storage 114 may contain additional instructions as well, including instructions to transmit data to, receive data from, interact with, and/or control one or more of propulsion system 102, sensor system 104, control system 106, and peripherals 108.

In addition to instructions 115, data storage 114 may store data such as roadway maps, path information, among other information. Such information may be used by vehicle 100 and computer system 112 during the operation of vehicle 100 in the autonomous, semi-autonomous, and/or manual modes.

Vehicle 100 may include user interface 116 for providing information to or receiving input from a user of vehicle 100. User interface 116 may control or enable control of content and/or the layout of interactive images that could be displayed on touchscreen 148. Further, user interface 116 could include one or more input/output devices within the set of peripherals 108, such as wireless communication system 146, touchscreen 148, microphone 150, and speaker 152.

Computer system 112 may control the function of vehicle 100 based on inputs received from various subsystems (e.g., propulsion system 102, sensor system 104, and control system 106), as well as from user interface 116. For example, computer system 112 may utilize input from sensor system 104 in order to estimate the output produced by propulsion system 102 and control system 106. Depending upon the embodiment, computer system 112 could be operable to monitor many aspects of vehicle 100 and its subsystems. In some embodiments, computer system 112 may disable some or all functions of the vehicle 100 based on signals received from sensor system 104.

The components of vehicle 100 could be configured to work in an interconnected fashion with other components within or outside their respective systems. For instance, in an example embodiment, camera 130 could capture a plurality of images that could represent information about a state of an environment of vehicle 100 operating in an autonomous mode. The state of the environment could include parameters of the road on which the vehicle is operating. For example, computer vision system 140 may be able to recognize the slope (grade) or other features based on the plurality of images of a roadway. Additionally, the combination of GPS 122 and the features recognized by computer vision system 140 may be used with map data stored in data storage 114 to determine specific road parameters. Further, radar unit 126 may also provide information about the surroundings of the vehicle.

In other words, a combination of various sensors (which could be termed input-indication and output-indication sensors) and computer system 112 could interact to provide an indication of an input provided to control a vehicle or an indication of the surroundings of a vehicle.

In some embodiments, computer system 112 may make a determination about various objects based on data that is provided by systems other than the radio system. For example, vehicle 100 may have lasers or other optical sensors configured to sense objects in a field of view of the vehicle. Computer system 112 may use the outputs from the various sensors to determine information about objects in a field of view of the vehicle, and may determine distance and direction information to the various objects. Computer system 112 may also determine whether objects are desirable or undesirable based on the outputs from the various sensors.

Although FIG. 1 shows various components of vehicle 100, i.e., wireless communication system 146, computer system 112, data storage 114, and user interface 116, as being integrated into the vehicle 100, one or more of these components could be mounted or associated separately from vehicle 100. For example, data storage 114 could, in part or in full, exist separate from vehicle 100. Thus, vehicle 100 could be provided in the form of device elements that may be located separately or together. The device elements that make up vehicle 100 could be communicatively coupled together in a wired and/or wireless fashion.

Figure 2A:
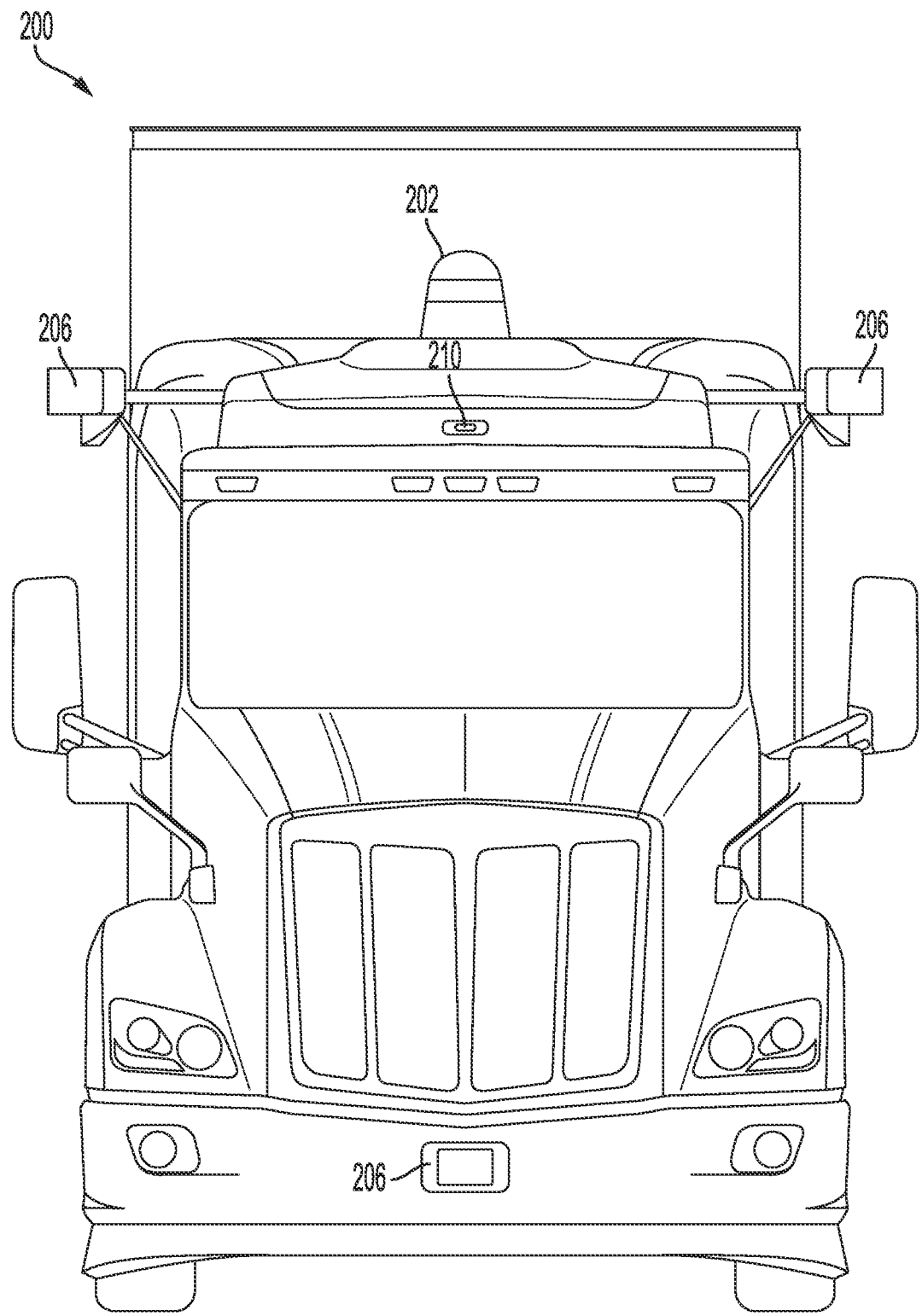
FIG. 2A illustrates a front view of a vehicle, according to one or more example embodiments.
Figure 2B:
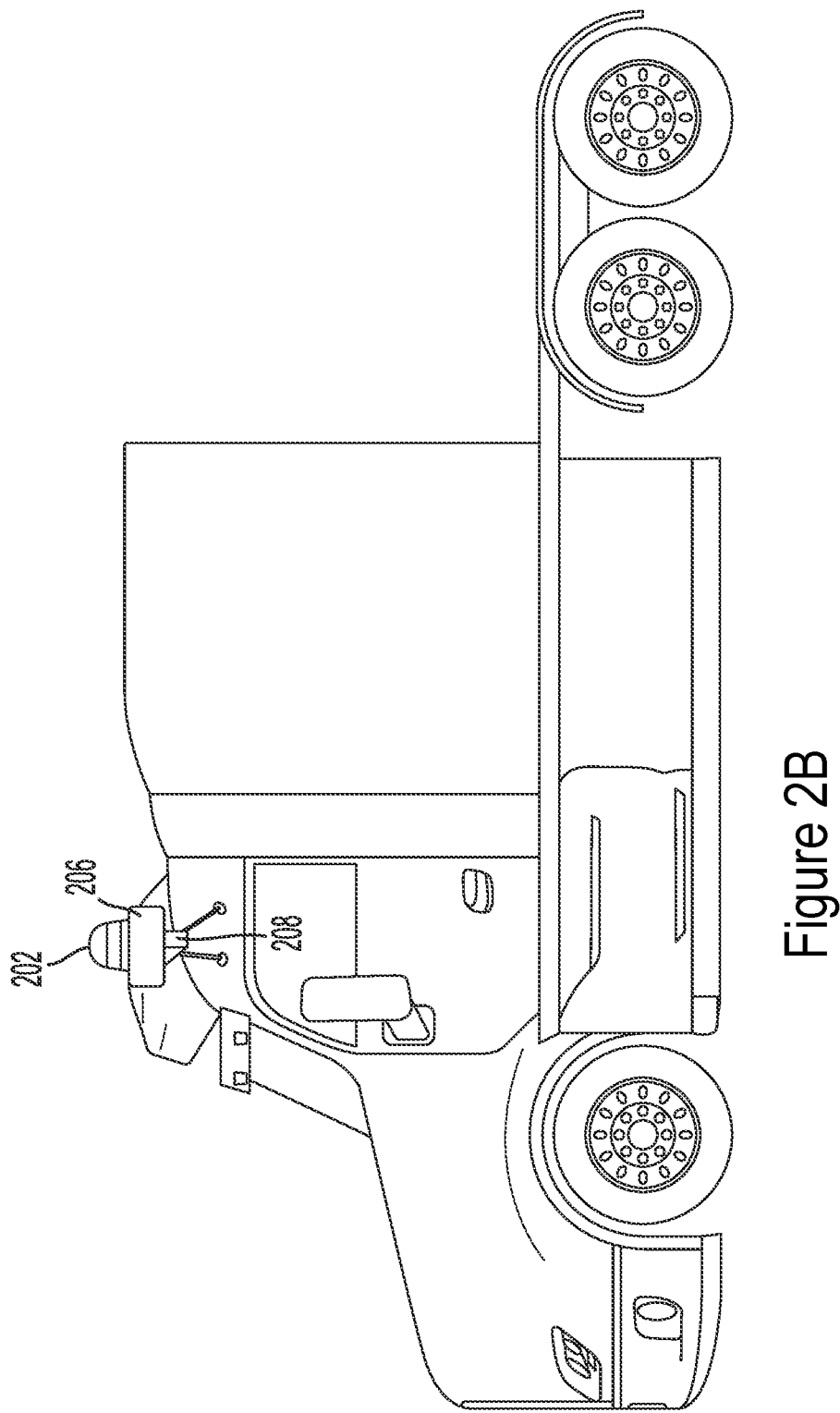
FIG. 2B illustrates a side view of a vehicle, according to one or more example embodiments.
Figure 2C:
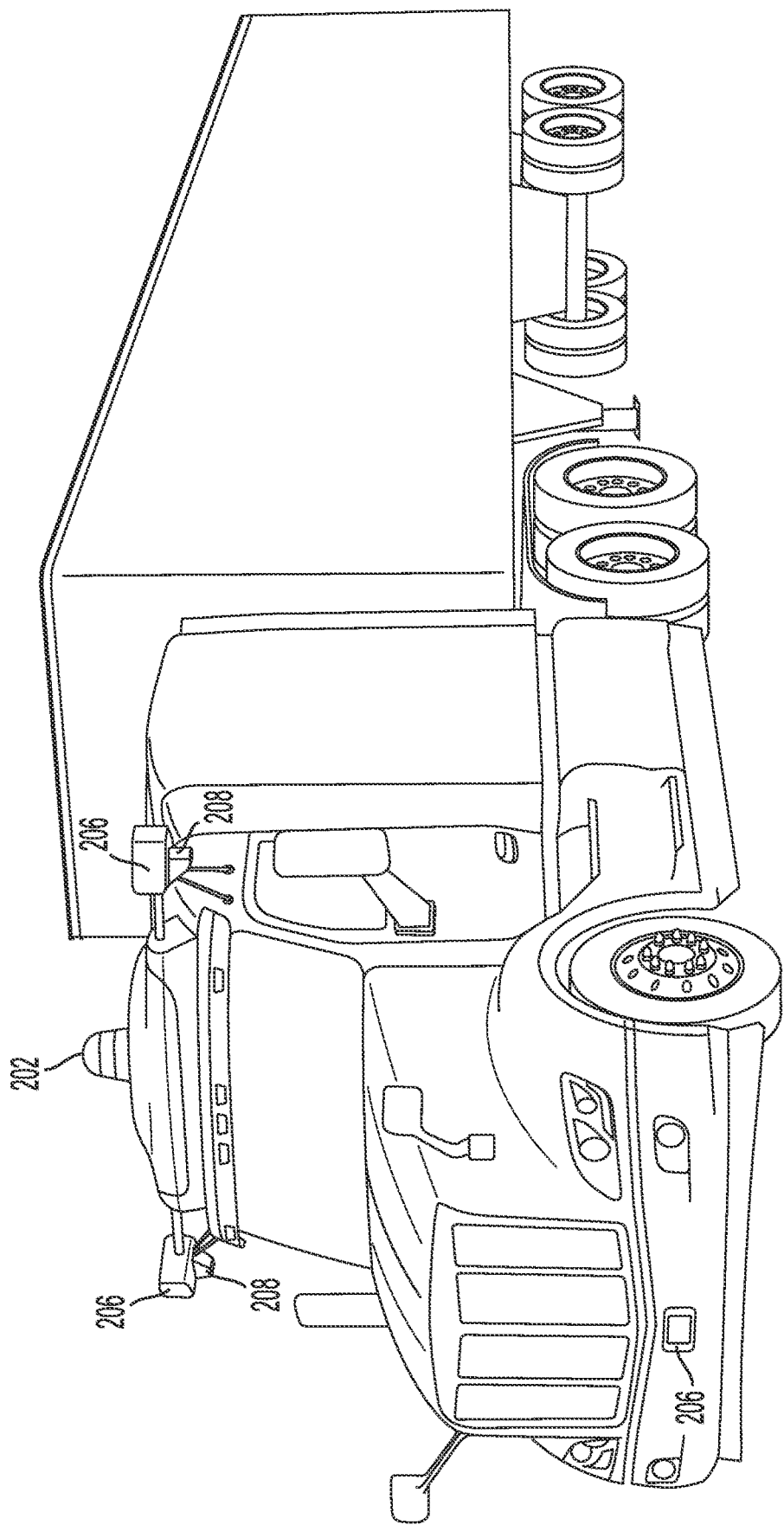
FIG. 2C illustrates a perspective view of a vehicle, according to one or more example embodiments.
Figure 2D:
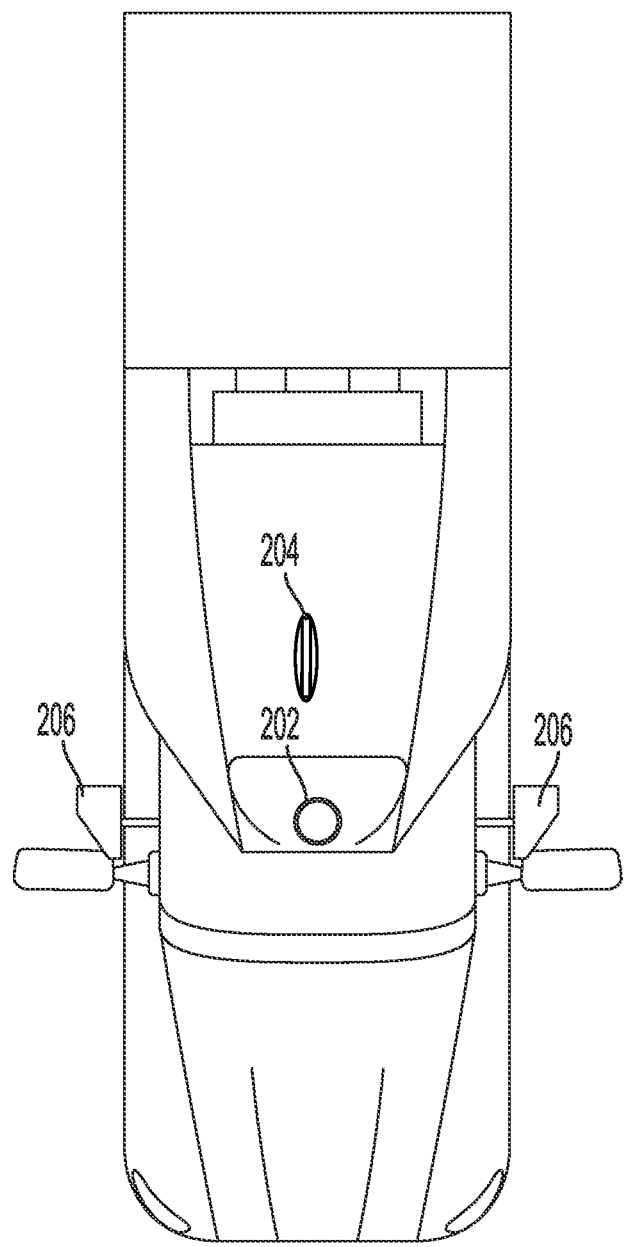
FIG. 2D illustrates a top view of a vehicle, according to one or more example embodiments.

FIG. 2A illustrates a front view of a vehicle 200, FIG. 2B illustrates a side view of a vehicle 200, FIG. 2C illustrates a perspective view of a vehicle 200, and FIG. 2D illustrates a top view of a physical configuration of a vehicle, according to example embodiments. As such, FIGS. 2A-2D together illustrate an example physical configuration of vehicle 200, which may represent one possible physical configuration of vehicle 100 described in reference to FIG. 1. Depending on the embodiment, vehicle 200 may include sensor unit 202, wireless communication system 204, radar unit 206, lidar units 208, and camera 210, among other possible components. For instance, vehicle 200 may include some or all of the elements of components described in FIG. 1. Although vehicle 200 is depicted in FIG. 2 as a semi-truck, vehicle 200 can have other configurations within examples, such as a car, a van, a motorcycle, a bus, a shuttle, a golf cart, an off-road vehicle, robotic device, a farm vehicle, or other vehicles pulling a trailer among other possible examples.

Sensor unit 202 may include one or more sensors configured to capture information of the surrounding environment of vehicle 200. For example, sensor unit 202 may include any combination of cameras, radars, lidars, range finders, radio devices (e.g., Bluetooth and/or 802.11), and acoustic sensors, among other possible types of sensors. In some implementations, sensor unit 202 may include one or more movable mounts operable to adjust the orientation of sensors in sensor unit 202. For example, the movable mount may include a rotating platform that can scan sensors so as to obtain information from each direction around vehicle 200. The movable mount of sensor unit 202 may also be movable in a scanning fashion within a particular range of angles and/or azimuths.

In some implementations, sensor unit 202 may include mechanical structures that enable sensor unit 202 to be mounted atop the roof of a truck. Additionally, other mounting locations are possible within examples.

Wireless communication system 204 may have a location relative to vehicle 200 as depicted in FIG. 2D, but can also have different locations. Wireless communication system 204 may include one or more wireless transmitters and one or more receivers that may communicate with other external or internal devices. For example, wireless communication system 204 may include one or more transceivers for communicating with a user's device, other vehicles, and roadway elements (e.g., signs, traffic signals), among other possible entities. As such, vehicle 200 may include one or more vehicular communication systems for facilitating communications, such as dedicated short-range communications (DSRC), radio frequency identification (RFID), and other proposed communication standards directed towards intelligent transport systems. Communication system 204 may include a cellular or wireless data connection. The communication system 204 may be configured to communicate with a remote computing system. The remote computing system may be configured to provide instructions and/or data to the vehicle 200 to aid in its autonomous operation.

The vehicle 200 may include several radar units 206 at various locations. In one example, the vehicle 200 may include a radar unit located on each of the front and back bumpers of the cab portion. Additionally, the vehicle 200 may include two radar units located on each side of the vehicle 200 near the side-view mirrors. The two radar units on the sides of the vehicle may be positioned so that one images a forward right section, one images a forward left section, one images a rear right section, and one images a rear left section. Each radar unit may be configured to transmit and receive radar signals over an angular region defined by a beamwidth of the radar unit. In some examples, each radar unit may be able to perform beam steering on either a transmit or receive beam. By using beam steering, a radar unit may be able to interrogate a predefined angular direction.

The vehicle 200 may also include lidar units 208 mounted in various locations. For example, lidar units 208 may also be mounted on the sides of the vehicle 200 near the rear-view mirrors. Lidar units 208 may be configured to transmit and receive light signals from the region around the vehicle. Lidar units 208 may be able to image the region around the vehicle 200 from which light reflections are received.

Camera 210 may have various positions relative to the vehicle 200, such as a location above a front windshield of vehicle 200. As such, camera 210 may capture images of the environment. For instance, camera 210 may capture images from a forward-looking view with respect to vehicle 200, but other mounting locations (including movable mounts) and viewing angles of camera 210 are possible within implementations. In some examples, camera 210 may correspond to one or more visible light cameras, but can also be other types of cameras (e.g., infrared sensor). Camera 210 may also include optics that may provide an adjustable field of view.

Figure 3:
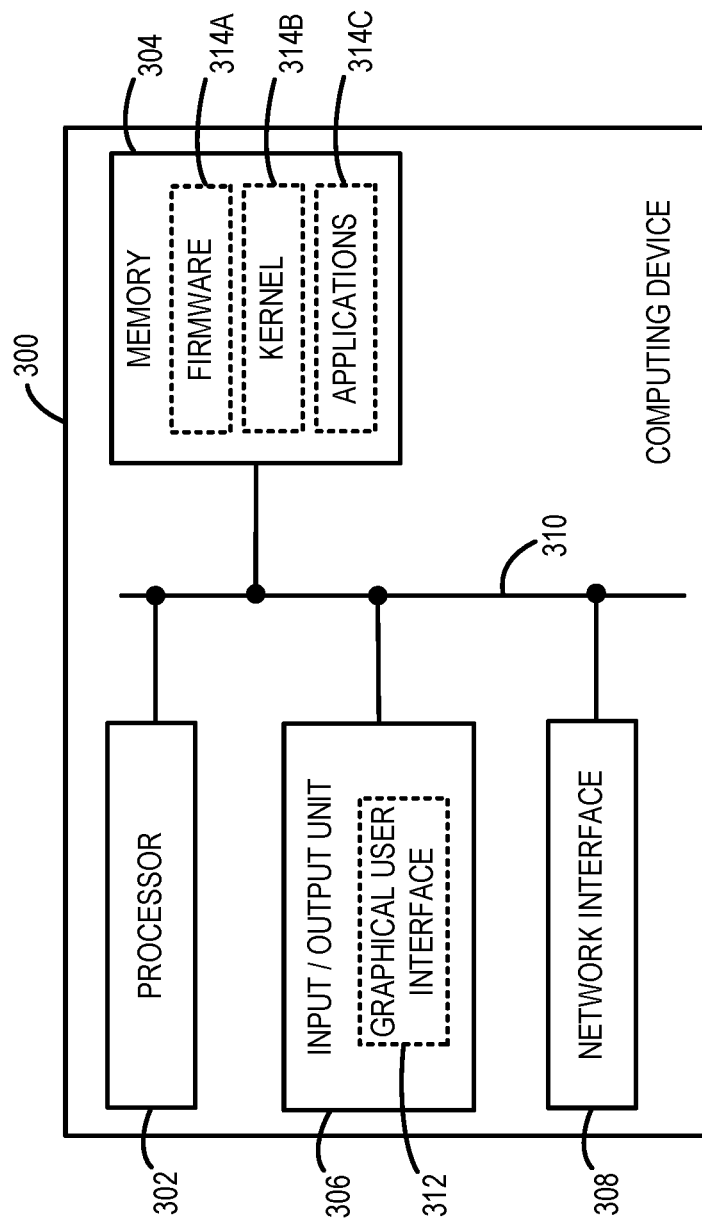
FIG. 3 is a functional block diagram illustrating a computing device, according to one or more example embodiments.

FIG. 3 is a simplified block diagram exemplifying computing device 300, illustrating some of the components that could be included in a computing device arranged to operate in accordance with the embodiments herein. Computing device 300 could be a client device (e.g., a device actively operated by a user (e.g., a remote operator)), a server device (e.g., a device that provides computational services to client devices), or some other type of computational platform. In some embodiments, computing device 300 may be implemented as computer system 112, which can be located on vehicle 100 and perform processing operations related to vehicle operations. For example, computing device 300 can be used to process sensor data received from sensor system 104. Alternatively, computing device 300 can be located remotely from vehicle 100 and communicate via secure wireless communication. For example, computing device 300 may operate as a remotely positioned device that a remote human operator can use to communicate with one or more vehicles.

In the example embodiment shown in FIG. 3, computing device 300 includes processing system 302, memory 304, input/output unit 306 and network interface 308, all of which may be coupled by a system bus 310 or a similar mechanism. In some embodiments, computing device 300 may include other components and/or peripheral devices (e.g., detachable storage, sensors, and so on).

Processing system 302 may be one or more of any type of computer processing element, such as a central processing unit (CPU), a co-processor (e.g., a mathematics, graphics, or encryption co-processor), a digital signal processor (DSP), a network processor, and/or a form of integrated circuit or controller that performs processor operations. In some cases, processing system 302 may be one or more single-core processors. In other cases, processing system 302 may be one or more multi-core processors with multiple independent processing units. Processing system 302 may also include register memory for temporarily storing instructions being executed and related data, as well as cache memory for temporarily storing recently-used instructions and data.

Memory 304 may be any form of computer-usable memory, including but not limited to random access memory (RAM), read-only memory (ROM), and non-volatile memory. This may include flash memory, hard disk drives, solid state drives, rewritable compact discs (CDs), rewritable digital video discs (DVDs), and/or tape storage, as just a few examples.

Computing device 300 may include fixed memory as well as one or more removable memory units, the latter including but not limited to various types of secure digital (SD) cards. Thus, memory 304 can represent both main memory units, as well as long-term storage. Other types of memory may include biological memory.

Memory 304 may store program instructions and/or data on which program instructions may operate. By way of example, memory 304 may store these program instructions on a non-transitory, computer-readable medium, such that the instructions are executable by processing system 302 to carry out any of the methods, processes, or operations disclosed in this specification or the accompanying drawings.

As shown in FIG. 3, memory 304 may include firmware 314A, kernel 314B, and/or applications 314C. Firmware 314A may be program code used to boot or otherwise initiate some or all of computing device 300. Kernel 314B may be an operating system, including modules for memory management, scheduling and management of processes, input/output, and communication. Kernel 314B may also include device drivers that allow the operating system to communicate with the hardware modules (e.g., memory units, networking interfaces, ports, and busses), of computing device 300. Applications 314C may be one or more userspace software programs, such as web browsers or email clients, as well as any software libraries used by these programs. In some examples, applications 314C may include one or more neural network applications and other deep learning-based applications. Memory 304 may also store data used by these and other programs and applications.

Input/output unit 306 may facilitate user and peripheral device interaction with computing device 300 and/or other computing systems. Input/output unit 306 may include one or more types of input devices, such as a keyboard, a mouse, one or more touch screens, sensors, biometric sensors, and so on. Similarly, input/output unit 306 may include one or more types of output devices, such as a screen, monitor, printer, speakers, and/or one or more light emitting diodes (LEDs). Additionally or alternatively, computing device 300 may communicate with other devices using a universal serial bus (USB) or high-definition multimedia interface (HDMI) port interface, for example. In some examples, input/output unit 306 can be configured to receive data from other devices. For instance, input/output unit 306 may receive sensor data from vehicle sensors.

As shown in FIG. 3, input/output unit 306 includes GUI 312, which can be configured to provide information to a remote operator or another user. GUI 312 may involve one or more display interfaces, or another type of mechanism for conveying information and receiving inputs. In some examples, the representation of GUI 312 may differ depending on a vehicle situation. For example, computing device 300 may provide GUI 312 in a particular format, such as a format with a single selectable option for a remote operator to select from.

Network interface 308 may take the form of one or more wireline interfaces, such as Ethernet (e.g., Fast Ethernet, Gigabit Ethernet, and so on). Network interface 308 may also support communication over one or more non-Ethernet media, such as coaxial cables or power lines, or over wide-area media, such as Synchronous Optical Networking (SONET) or digital subscriber line (DSL) technologies. Network interface 308 may additionally take the form of one or more wireless interfaces, such as IEEE 802.11 (Wifi), BLUETOOTH®, global positioning system (GPS), or a wide-area wireless interface. However, other forms of physical layer interfaces and other types of standard or proprietary communication protocols may be used over network interface 308. Furthermore, network interface 308 may comprise multiple physical interfaces. For instance, some embodiments of computing device 300 may include Ethernet, BLUETOOTH®, and Wifi interfaces. In some embodiments, network interface 308 may enable computing device 300 to connect with one or more vehicles to allow for remote assistance techniques presented herein.

In some embodiments, one or more instances of computing device 300 may be deployed to support a clustered architecture. The exact physical location, connectivity, and configuration of these computing devices may be unknown and/or unimportant to client devices. Accordingly, the computing devices may be referred to as "cloud-based" devices that may be housed at various remote data center locations. In addition, computing device 300 may enable the performance of embodiments described herein, including efficient assignment and processing of sensor data.

Computing device 300 may perform route optimization techniques described herein. In some cases, computing device 300 may determine route and/or control instructions for a vehicle. In some embodiments, computing device 300 may be onboard a vehicle. In such cases, computing device 300 may analyze sensor data in real-time to optimize maneuverability of the vehicle during navigation. In other embodiments, computing device 300 may be positioned remotely from the vehicle. In such cases, computing device 300 may be an individual computing device or it may be a fleet manager device receiving sensor data from more than one vehicle. Further, analyzing sensor data in such cases may involve running one or more simulations based on the sensor data to determine the level of feasibility of a maneuver for a particular vehicle.

Figure 4A:
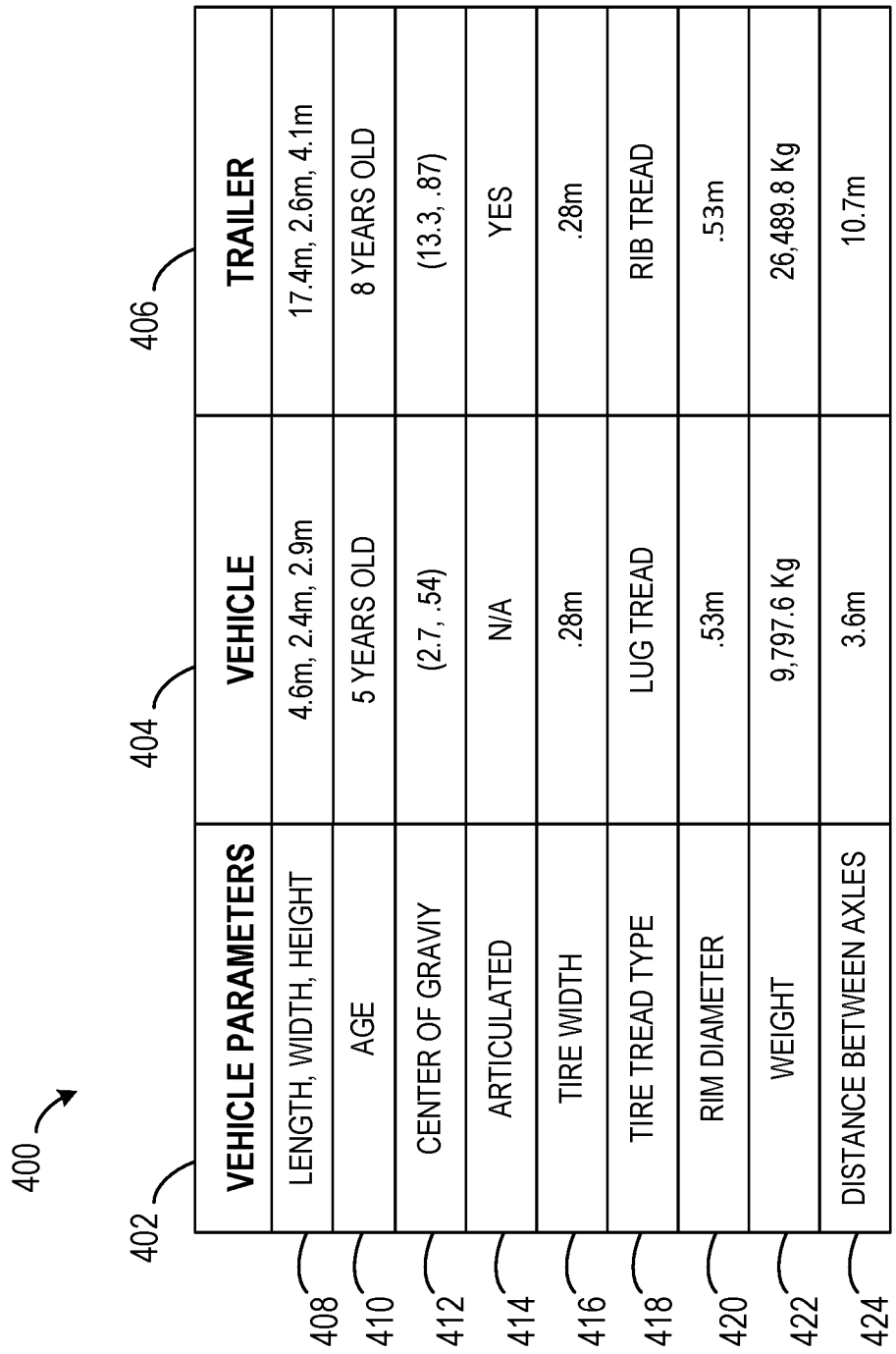
FIG. 4A is a table of vehicle parameters that can be used during route simulations, according to one or more example embodiments.

FIG. 4A illustrates table 400 displaying example vehicle parameters 402, according to an example embodiment. A computing device may use vehicle parameters 402 (or a subset of vehicle parameters 402) to simulate potential routes for navigation for a vehicle (e.g., vehicle 404). For instance, computing device 300 shown in FIG. 3 or computing system 112 shown in FIG. 1 may perform operations disclosed herein using information provided in table 400.

Table 400 represents vehicle parameters 402 for vehicle 404 and trailer 406. In particular, vehicle 404 may represent the vehicle that will subsequently navigate a route based on the route instructions provided by the computing device using table 400. In the example shown in FIG. 4A, vehicle 404 is configured to pull trailer 406. In other examples, the vehicle may not pull a trailer. As such, the different metrics shown in table 400 are included to illustrate potential information that a computing device can use to simulate and identify one or more routes for vehicle 404 to use during navigation. In other examples, table 400 can include other types of information.

As shown in FIG. 4A, vehicle parameters 402 include length, width, height 408, age 410, center of gravity 412, whether or not trailer 406 is articulated 414, tire width 416, tire tread type 418, rim diameter 420, weight 422, and distance between axles 424. Other vehicle parameters can be considered in addition and/or in replacement of example vehicle parameters 402 shown in FIG. 4A. For instance, the material of the load can influence route determination if the load is hazardous or oversized. As such, a computing device performing disclosed operations may use one or more of these parameters to simulate potential routes for vehicle 404.

For example, length, width, and height 408 of vehicle 404 and trailer 406 determine certain feasible and infeasible routes for vehicle 404 with trailer 406. For instance, the federal government recommends that bridges on public roads have a clearance of at least 4.27 meters (m) to ensure safe navigation underneath. However, in urban areas or on private roads, this clearance might be lowered. Because trailer 406 has a height of 4.1 m, vehicle 404 with trailer 406 will be able to safely navigate under most bridges on public roads, but it might be infeasible for vehicle 404 with trailer 406 to navigate on certain private roads or in urban areas with obstacles that have a clearance height of less than 4.1 m. Further, vehicle 404 with trailer 406 will have a certain minimum turn radius based at least in part on the width and length of vehicle 404 with trailer 406. Longer and wider vehicles might require more lateral clearance on roads in order to safely execute a turn. Therefore, the feasibility of a particular turn may in part depend on the length and width of vehicle 404 and trailer 406.

Age 410 of vehicle 404 and trailer 406 might also be relevant in consideration of certain maneuvers to be performed by vehicle 404 and trailer 406. As vehicular components age, maneuverability of those components may decrease. Therefore, the older that vehicle 404 and trailer 406 are, the less likely they may be able to perform certain maneuvers. In turn, certain maneuvers may no longer be feasible because vehicle 404 and/or trailer 406 might be worn down too much to safely navigate the maneuver.

Center of gravity 412 of vehicle 404 and trailer 406 might also affect the maneuverability of vehicle 404 and trailer 406 along certain routes. Although the center of gravity of vehicle 404 stays relatively consistent, the center of gravity of trailer 406 can vary greatly, especially being dependent on the load within trailer 406. For instance, the higher the center of gravity of a vehicle, the more susceptible it is to flipping, turning over, or rolling during a turn. As an example, if the load within trailer 406 is top-heavy, the center of gravity of trailer 406 may be higher, and certain tight turns that might be feasible with an empty trailer 406 alone, for instance, might not be feasible with the new, higher center of gravity. Therefore, the center of gravity might be taken into consideration when determining feasibility of certain maneuvers of vehicle 404 with trailer 406.

If vehicle 404 has trailer 406, it might be important to know whether or not trailer 406 is articulated 414. An articulated trailer is a trailer which has a permanent or semi-permanent pivot joint in its construction, allowing the vehicle to turn more sharply. If trailer 406 is articulated, vehicle 404 might be able to complete tighter maneuvers when compared to instances when trailer 406 is not articulated.

Additionally, tire width 416, tire tread type 418, and rim diameter 420 of vehicle 404 and trailer 406 may impact some maneuvers for vehicle 404 with trailer 406. Larger tire width 416 and rim diameter 420 may make tighter turns less feasible. Further, tread type 418 can also have an impact on maneuverability of vehicle 404 with trailer 406. For instance, symmetrical tire patterns have high directional stability while asymmetric tire tread patterns have high curve stability. A block or lug tread is designed specifically for improved traction between the tire and the road surface whereas a rib tread does not provide enhanced traction between the tire and the road surface. Therefore, if vehicle 404 with trailer 406 utilizes symmetrical tire treads, such as a rib tread, tighter turns may not be safely maneuverable, as curve stability is not high.

Weight 422 of vehicle 404 and trailer 406 might also impact vehicle's 404 ability to navigate through certain maneuvers and/or on certain roads. The weight and weight distribution of vehicle 404 with trailer 406 might influence how quickly the vehicle 404 can accelerate and decelerate, as well as how easily vehicle 404 with trailer 406 turns when cornering. These parameters, as well as others, can impact the slopes of roads that vehicle 404 may be safely able to navigate. The weight and weight transfers that occur when vehicle 404 with trailer 406 is moving can affect the levels of tire grip, and thus impact the feasibility of safe maneuvering of vehicle 404 with trailer 406 during some portions of routes Distance between axles 424 may impact the feasibility of certain maneuvers of vehicle 404 with trailer 406. The longer the wheelbase of a vehicle, the larger the turning radius. Therefore, if vehicle 404 with trailer 406 has a greater distance between its axles, tighter turns may not be feasible to be safely executed because the turning radius of vehicle 404 with trailer 406 may be greater.

Other parameters to detail one or more physical attributes about both vehicle 404 and trailer 406 might also be relevant. In embodiments where the computing device is positioned remotely from vehicle 404, vehicle parameters 402 can be relevant to an analysis of the sensor data because the computing device may perform one or more simulations based on incoming sensor data from vehicle sensors to determine how vehicle 404 should perform an upcoming maneuver (or if vehicle 404 should adjust its current route). By using a combination of sensor data and vehicle parameters 402, vehicle navigation can be adjusted in real-time.

In some examples, the computing device may apply different weightings to vehicle parameters 402 when performing simulations using vehicle parameters 402. For instance, the computing device may assign a higher weight to vehicle weight 422 and length, width, height 408 relative to other parameters so that the height weighted parameters have a greater influence on the simulations. In addition, the computing device can be able to enable a human operator to adjust the weightings applied to vehicle parameters 402 in some examples.

FIG. 4B illustrates table 430 depicting external parameters 432, according to one or more embodiments. In some embodiments, a computing device may further use external parameters 432 during simulations to test and determine a route for a vehicle to navigate in an autonomous or semi-autonomous mode. The computing device may use external parameters 432 (or a subset of external parameters 432) shown in FIG. 4B during simulations to identify one or more routes to provide to a vehicle (e.g., vehicle 404). As such, table 430 is shown for illustration purposes and may include more or fewer external parameters 432 in other embodiments.

As shown in FIG. 4B, external parameters 432 includes map data 434, traffic data 436, weather data 438, and cost information 440. A computing device may receive external parameters 432 from other sources (e.g., databases, vehicle 404) and/or from memory. The computing device may apply a different weighting to these parameters during simulations to determine a route for a vehicle to use.

Map data 434 represents information that can be used to plan and simulate routes. Map data 434 can indicate positions of roads and potential obstacles, such as construction zones, bridges, train crossings, etc. Map data 434 can convey speed limits, road boundaries, positions of charging stations and/or gas stations, etc. In some examples, map data 434 may be updated in near real-time via information from vehicles traveling in the different areas along potential routes. As an example route, map data 434 may reflect changes in environments in near real-time, such as accidents and other potential factors that can impact route determination.

Traffic data 436 represents potential traffic conditions that may impact route determination. For instance, traffic data 436 can indicate historical average traffic conditions for roads across different times of the day. In some examples, traffic data 436 may represent traffic conditions in near real-time. The traffic conditions can be based on sensor data received from various vehicles operating in the different areas of potential routes for vehicle 404. As such, simulations can be performed that factor traffic conditions to help avoid routes that are impacted by traffic congestion. In some instances, traffic data 436 may indicate the locations of accidents that can impact route planning.

Weather data 438 can indicate weather conditions for different portions of the route. As such, weather data 438 may indicate potential weather conditions and/or current weather conditions. A computing device may use weather data 438 when determining routes. For instance, rain or other weather conditions may impact navigation on roads and can be factored when performing route determination operations disclosed herein. In addition, cost information 440 represents different costs that can be factored into simulations, such as toll roads, fuel costs, and/or other costs that can impact route determination. A computing device may also factor cost information 440 when performing operations disclosed herein.

Similar to table 400 shown in FIG. 4A, a computing device performing disclosed operations can use and weight different parameters shown in FIG. 4B differently during simulations. In addition, the computing device can also enable a human operator to adjust the weightings applied to the different parameters, remove or add additional parameters, and perform other actions that can influence simulation results.

FIG. 5A, FIG. 5B, FIG. 6A, and FIG. 6B illustrate example scenarios that a vehicle operating in an autonomous or semi-autonomous mode of navigation may temporarily adjust operation parameters to perform maneuvers during travel, such as tight turns. When navigating on surface streets, a vehicle might encounter one or more maneuvers that are difficult to perform under standard operating procedures. For instance, tight turns and other navigation maneuvers can be particularly difficult for semi-trucks and other types of larger vehicles to perform. In such situations, vehicle systems may temporarily operate in a secondary mode that differs from the primary mode used during autonomous or semi-autonomous navigation in normal road conditions, such as straight navigation on highways and other roadways. The secondary mode may enable vehicle systems to determine and use additional space when performing certain maneuvers, such as tight turns. For example, a vehicle may extend the space used to perform a tight turn by identifying an available neighboring lane next to the vehicle's current lane that the vehicle (or a portion of the vehicle or trailer) may temporarily extend into in order to complete the turn.

In some examples, vehicle systems may identify a nearby lane that is unoccupied by other vehicles or obstacles and use a portion of the nearby lane along with its current lane to complete turns or other difficult maneuvers (e.g., U-turns). Temporary expansion into another lane or additional space next to the vehicle's current lane can enable wider turns and other movements to be performed by the vehicle.

In some examples, vehicle systems may control a vehicle during autonomous navigation within an allowable configuration space relative to road boundaries (e.g., lane markers). The allowable configuration space may define the outer boundaries of allowable occupation of the vehicle. In such examples, during navigation, the vehicle might be required to remain within the configuration space. For instance, during standard operating conditions, the configuration space might be a typical, single lane of travel. However, when expanding the configuration space of a vehicle beyond standard operating conditions (e.g., the given lane in which the vehicle is currently located) for more difficult maneuvers, the outer boundaries that may govern the operating limits of the vehicle can be widened to include an adjacent area, including a portion or the entirety of a neighboring lane, a portion of a curb, or the like. The examples illustrated in FIGS. 5A-6B embody the outer boundaries of the configuration space fully occupying a neighboring lane for simplicity, but embodiments are possible in which the configuration space includes only a portion of an adjacent area or in which only a portion of the vehicle is allowed to expand its outer boundaries at all.

Figure 5A:
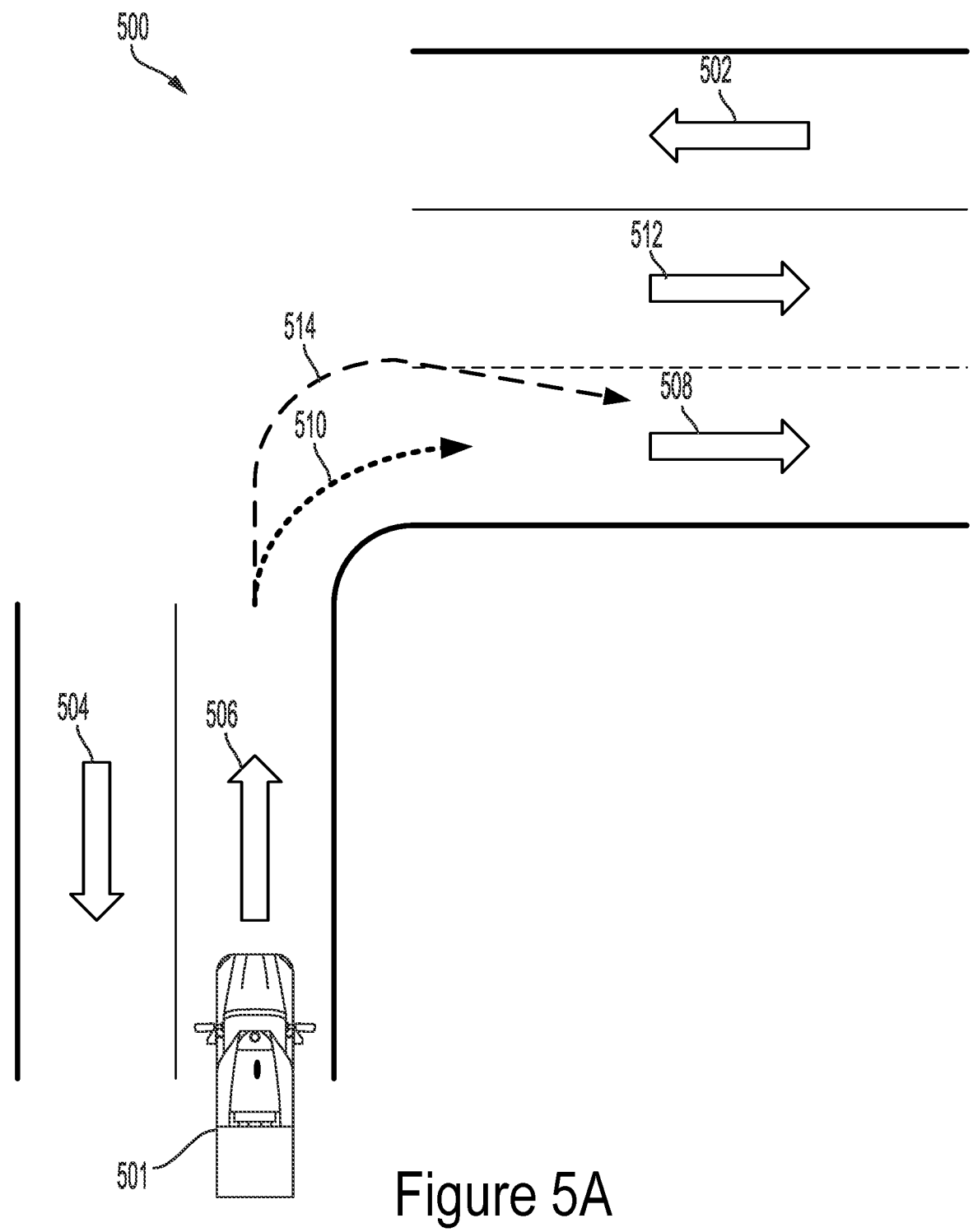
FIG. 5A illustrates a vehicle maneuver, according to one or more example embodiments.

FIG. 5A illustrates vehicle 501 performing a turn at intersection 500, according to an example embodiment. The example embodiment shows a situation involving intersection 500 where vehicle 501 may perform disclosed operations to temporarily expand the drivable area used by vehicle 501 to enable performance of a tight right turn. For instance, vehicle 501 may be a semi-truck pulling a trailer, which can increase the difficulty associated with performing tight turns. As such, vehicle 501 may perform disclosed techniques to enable vehicle 501 and the corresponding trailer to execute the right turn safely despite having a larger length and width that exceeds the size of many passenger vehicles.

Vehicle sensors on vehicle 501 can enable vehicle systems (e.g., computing device 300 shown in FIG. 3 or computing system 112 shown in FIG. 1) to determine whether or not a particular maneuver can be safely executed by the vehicle in real-time. In particular, sensor data can indicate where additional space may be unoccupied and available for portions of vehicle 501 to temporarily use to complete the right hand turn. As such, the sensor data can be used to further determine that the additional space is not currently occupied by potential obstacles, such as other vehicles, pedestrians, etc.

In the example embodiment shown in FIG. 5A, vehicle 501 may detect that a right turn from single lane 506 entering into intersection 500 can involve using either lane 508 and/or lane 512. During autonomous or semi-autonomous operation, vehicle 501 may be configured to complete a right turn from lane 506 into lane 508 via right turn path 510. This may be due to rules of the road, expectations of other drivers, or other reasons. For instance, vehicles navigating through the intersection using lane 512 may expect vehicles performing right turns from lane 506 to use lane 508.

In some instances, vehicle 501 may be configured to further detect that intersection 500 configured with another lane 512 in the same direction as lane 508 offers additional space that vehicle 501 may temporarily use to perform a wider turn. As such, vehicle systems may detect additional space that is unoccupied by other vehicles or other potential obstacles (e.g., pedestrians) and perform a wider turn as shown as right turn path 514. As shown in FIG. 5A, right turn path 514 is a wider turn that takes advantage of the additional space and enables vehicle 501 to complete the turn safely temporarily using additional space outside the standard right turn path 510 prior to returning back to lane 508.

In some examples, the computing device could perform a simulation similar to the simulation described in FIG. 4, taking into account differing vehicle parameters and determining if the maneuver can be safely executed. For instance, upon approaching the intersection, vehicle 501 may simulate a wider right turn that can then be performed in real-time based on the vehicle's perception of the surrounding environment.

Figure 5B:
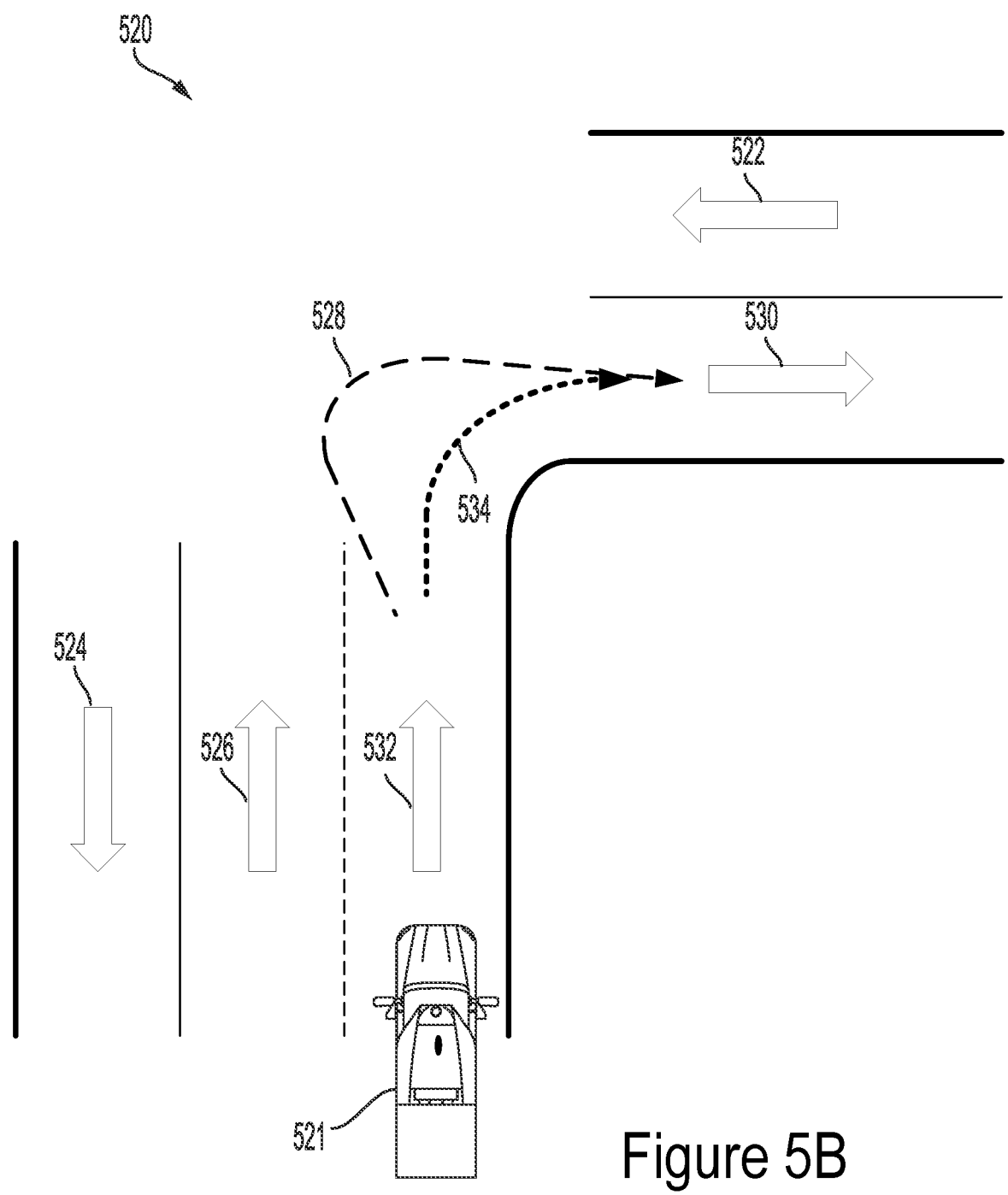
FIG. 5B illustrates a vehicle maneuver, according to one or more example embodiments.

FIG. 5B illustrates another situation that involves vehicle 521 performing a right turn at intersection 520, according to an example embodiment. Intersection 520 includes lanes 526, 532 configured for traffic traveling north, lane 524 configured for traveling south, lane 522 for traffic traveling west and lane 530 for traveling east. With vehicle 521 traveling in lane 532, performance of a right hand turn may typically involve turning right according to right turn path 534. Right turn path 534, however, may be too tight for vehicle 521 to perform due to the size or length of vehicle 521. For instance, vehicle 521 may be a semi-truck pulling a trailer. As such, vehicle 521 may use sensor data to determine that lane 526 is currently unoccupied by other obstacles (e.g., vehicles, pedestrians) and temporarily use a portion of lane 526 to complete the right turn as represented by wide right turn path 528. Upon completion of the right turn via wide right turn path 528, vehicle 521 can return to navigation in lane 530.

Figure 6A:
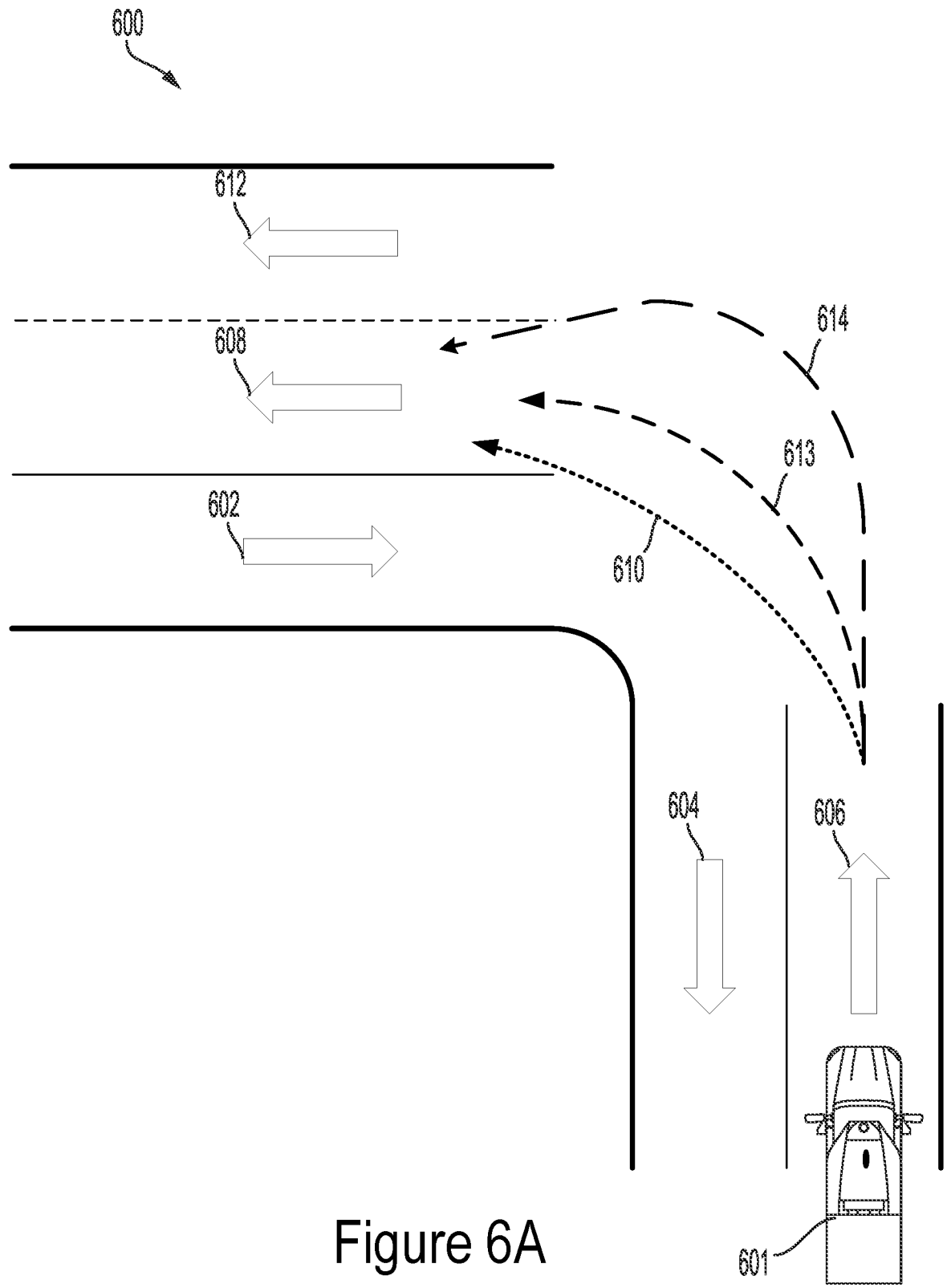
FIG. 6A illustrates a vehicle maneuver, according to one or more example embodiments.

FIG. 6A illustrates vehicle 601 performing a left turn at intersection 600, according to an example embodiment. Performance of the left turn may involve vehicle 601 analyzing intersection 600 for other vehicles, pedestrians, and other potential objects. When vehicle 601 determines the area is free of obstacles, vehicle 601 may perform the left turn according to one of example left turn paths 610, 613, 614 shown in FIG. 6A. In particular, vehicle 601 may select and perform a left turn based on the abilities of vehicle 601 when sensor data indicates the area within intersection 600 is available to perform the selected left turn. For instance, vehicle 601 may perform left turn 614 that temporarily uses lane 612 prior to returning to lane 608. In addition, left turn paths 610, 613, 614 are shown as potential examples and other vehicle 601 could perform variations of these turns in other examples. As further shown, after completion of the left turn via left turn paths 610, 613, 614, vehicle 601 can return to straight navigation within lane 608.

Figure 6B:
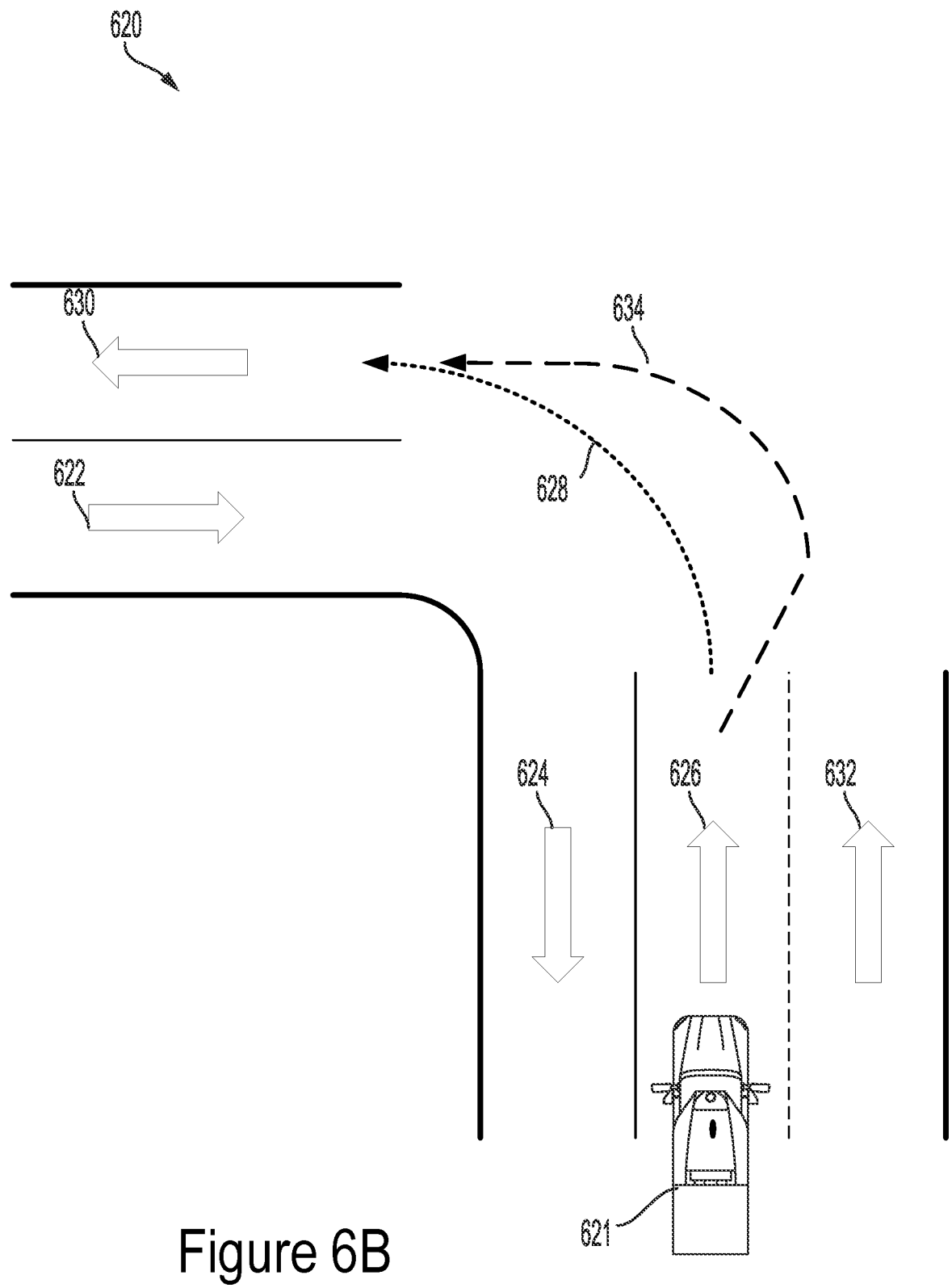
FIG. 6B illustrates a vehicle maneuver, according to one or more example embodiments.

FIG. 6B illustrates vehicle 621 performing a left turn at intersection 620, according to an example embodiment. Similar to the left turn scenario shown in FIG. 6A, vehicle 621 traveling in lane 626 may perform a left turn according to different left turn paths, such as left turn path 628 or wide left turn path 634. Vehicle 621 may use sensor data to detect additional space available to complete the turn in real-time, which may involve using portions of lane 632. In the example embodiment, intersection 620 includes lanes 622, 624, 626, 630, and 632 with arrows indicating the appropriate direction of travel of each lane.

Performing a left turn from lane 626 can involve vehicle 621 using sensor data to identify when additional space is available and perform a left turn that uses the additional space as represented by wide left turn path 634. This may involve confirming that no vehicles are traveling in lane 632 and through intersection 620 when vehicle 621 executes wide left turn path 634. In other examples, vehicle 621 may use other left turn paths that take advantage of available areas within intersection 620.

Figure 7:
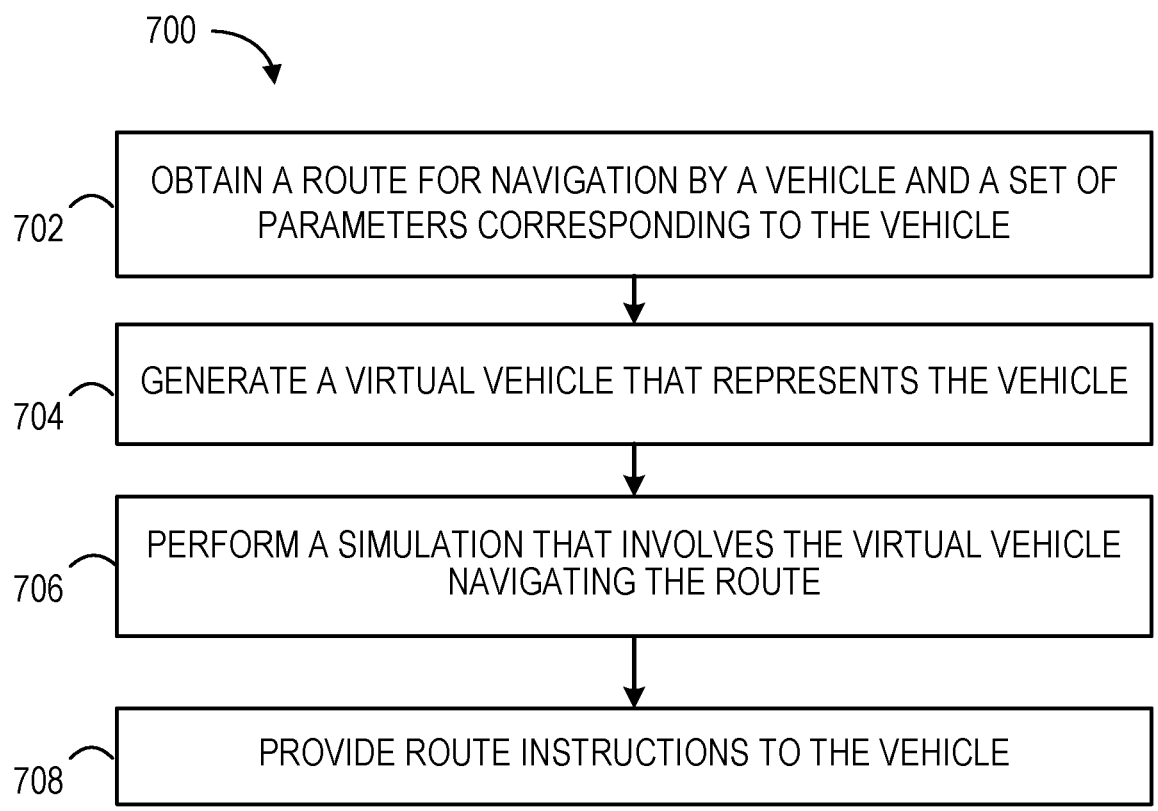
FIG. 7 is a flowchart of a method for automated route planning, according to one or more example embodiments.

FIG. 7 is a method for automated routing planning, according to one or more example embodiments. Method 700 represents an example method that may include one or more operations, functions, or actions, as depicted by one or more of blocks 702, 704, 706, and 708, each of which may be carried out by any of the systems, devices, and/or vehicles shown in FIGS. 1-6B, among other possible systems. For instance, the computing device depicted in FIG. 3 may perform method 700.

Those skilled in the art will understand that the flowchart described herein illustrates functionality and operations of certain implementations of the present disclosure. In this regard, each block of the flowchart may represent a module, a segment, or a portion of program code, which includes one or more instructions executable by one or more processors for implementing specific logical functions or steps in the process. The program code may be stored on any type of computer readable medium, for example, such as a storage device including a disk or hard drive.

In addition, each block may represent circuitry that is wired to perform the specific logical functions in the process. Alternative implementations are included within the scope of the example implementations of the present application in which functions may be executed out of order from that shown or discussed, including substantially concurrent or in reverse order, depending on the functionality involved, as may be understood by those reasonably skilled in the art.

At block 702, method 700 involves obtaining a route for navigation by a vehicle and a set of vehicle parameters corresponding to the vehicle. Each vehicle parameter may represent a physical attribute of the vehicle. In some examples, a computing device may receive, from the vehicle, the route for navigation by the vehicle and the set of vehicle parameters corresponding to the vehicle. The computing device may be remotely positioned from the vehicle.

In some examples, the vehicle is configured to pull a trailer during navigation of the route and the vehicle parameters may include at least one vehicle parameter that represents a physical attribute of the trailer. For instance, the set of vehicle parameters can indicate a height, a length, and a width of a combination of the vehicle and the trailer.

At block 704, method 700 involves generating a virtual vehicle that represents the vehicle. The computing device may generate the virtual vehicle based on the set of vehicle parameters. For instance, when the vehicle is pulling a trailer, the computing device may generate the virtual based on the length, width, and height of the vehicle and the trailer, the age, the center of gravity, whether or not the trailer is articulated, the tire width, the tire tread type, the rim diameter, the weight, or the distance between axles. Other parameters about the vehicle and the trailer are also possible to be considered in the simulation.

At block 706, method 700 involves performing a simulation that involves the virtual vehicle navigating the route. In some examples, the computing device may perform a first simulation that involves the virtual vehicle navigating the route and identifying a particular portion of the route that the vehicle performed below a threshold level based on the first simulation. The computing device may then perform a second simulation that involves the virtual vehicle navigating the particular portion of the route according to a first set of navigation parameters, such as a first speed and/or a first lane or road choice. Based on the second simulation, the computing device may modify the first set of navigation parameters to generate a second set of navigation parameters, such as a second speed and/or a second lane or road choice. The computing device may then perform a third simulation that involves the virtual vehicle navigating the particular portion of the route according to the second set of navigation parameters. This process can be iteratively performed until the virtual vehicle performs the particular portion of the route above a threshold performance level. For instance, the computing device may determine that the virtual vehicle navigated the particular portion of the route above a threshold confidence level (e.g., 99% confidence) based on the third simulation and provide route instructions based on the second set of navigation parameters responsive to determining that the virtual vehicle navigated the particular portion of the route above the threshold confidence level.

In some examples, the computing device may identify one or more portions of the route that the virtual vehicle navigated below a threshold success level based on the simulation. The computing device may then modify map data to indicate that the virtual vehicle navigated the one or more portions below the threshold success level. The vehicle can be configured to use the map data to determine subsequent routes, which may cause the vehicle to avoid the one or more portions during subsequent navigation. In addition, the computing device may modify the route such that navigation of the route avoids the one or more portions of the route that the virtual vehicle navigated below the threshold success level and store an indication of the modified route in the map data At block 708, method 700 involves providing route instructions to the vehicle. In some examples, the computing device is coupled to the vehicle and may control the vehicle based on the route instructions. In some examples, the computing device may modify the route to exclude one or more portions of the route based on the simulation and provide the modified route to the vehicle.

In some examples, method 700 further involves identifying, by the computing device, one or more portions of the route that involve performance of a navigation maneuver above a threshold difficulty level. For instance, a computing device may identify the one or more portions of the route based on map data that represents respective navigation maneuvers associated with navigation of the route. In some instances, the computing device may identify the one or more portions of the route based on one or more prior performances of at least a portion of the route of the vehicle. In further examples, the computing device may identify the one or more portions of the route based on one or more prior performances of at least a portion of the route by one or more vehicles. The one or more vehicles can have respective vehicle parameters that correspond to the set of vehicle parameters corresponding to the vehicle. As such, performing the simulation that involves the virtual vehicle navigating the route may involve performing the simulation such that the virtual vehicle only navigates the one or more portions of the route.

In some examples, method 700 further involves receiving weather information for areas corresponding to the route for navigation by the vehicle. The weather information can depend on a time that the vehicle is scheduled to navigate the route. As such, performing the simulation with the virtual vehicle navigating the route in simulated weather conditions based on the weather information for the areas corresponding to the route. Method 700 may also involve receiving traffic information for areas corresponding to the route for navigation by the vehicle. The traffic information can depend on a time that the vehicle is scheduled to navigate the route. The computing device may then perform the simulation with the virtual vehicle navigating the route in simulated traffic conditions based on the traffic information for the areas corresponding to the route.

Figure 8:
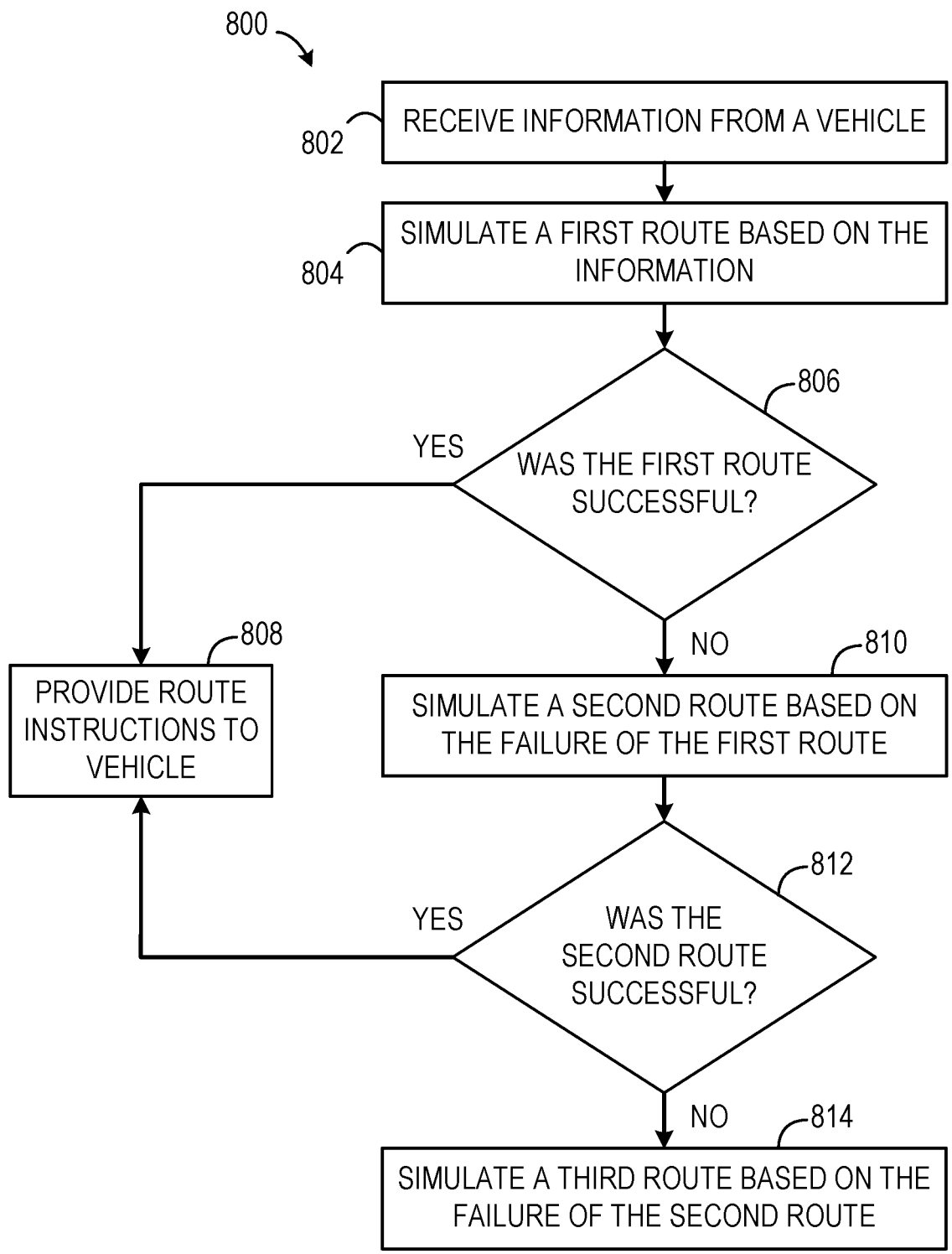
FIG. 8 is a flowchart of a method for simulating vehicle routes, according to one or more example embodiments.

FIG. 8 is a flowchart of a method for simulating vehicle routes, according to one or more example embodiments. Similar to other methods disclosed herein, method 800 represents an example method that may include one or more operations, functions, or actions, as depicted by one or more of blocks 802, 804, 806, 808, 810, 812, and 814, each of which may be carried out by any of the systems, devices, and/or vehicles shown in FIGS. 1-6B, among other possible systems. For instance, the computing device depicted in FIG. 3 may perform method 700.

At block 802, method 800 involves receiving information from a vehicle. The information can specify various aspects associated with the vehicle's location, target destination or destinations, and about the vehicle, such as the information shown in FIG. 4A. For example, the information can convey the vehicle's type, weight, size, trailer load, current location and target destination, and anticipated time of departure for the destination. This information can also include other data, such as map data, weather data, traffic data, and cost data as shown in FIG. 4B. The computing device may also obtain the information from other sources, such as databases, memory, etc.

At block 804, method 800 involves simulating a first route based on the information. The simulation may involve using a computer model that depends on the information received at block 802. For instance, a virtual vehicle can be modeled as a digital replica of the real-world vehicle to simulate the first route according to real-world parameters modeled based on map data and other information (e.g., weather and traffic conditions).

At block 806, method 800 involves determining if the first route was simulated successfully. In particular, the computing device determines if the first route may enable the vehicle to successfully reach its destination based on the first simulation. If so, method 800 then involves providing route instructions to the vehicle at block 808. The vehicle can then use the route instructions to travel to the destination. However, if the first route was not successful as determined in block 806, method 800 involves simulating a second route based on the failure of the first route at block 810. The second route may be modeled based on adjustments applied to the first route as determined via the first simulation. For instance, adjustments to the route can involve adjusting speeds, directions, roads used, lanes used, and/or maneuvers used, among other potential adjustments.

At block 812, method 800 involves determining whether the second route was successful. If the second simulation indicated that the second route was successful, the computing device can provide route instructions to the vehicle at block 808. If not, method 800 involves simulating a third route based on the failure of the second route at block 814. The third route can be based on the failures of both the first route and the second route in some examples. For instance, the computing device can leverage prior simulations to improve the routes and navigation parameters tested during subsequent simulations. At the next block, block 810, the computing device simulates a second route based on the information, including the received sensor data and the failure of the first route. If the virtual vehicle was able to successfully navigate the second route in block 812, the computing device may provide route instructions to the actual vehicle that it is safe to navigate according to the second route, as is indicated in block 808, and the navigation might be completed. However, if the virtual vehicle was not able to successfully navigate the second route in block 812, the computing device may continue to follow the steps of flowchart 800, which in this case may mean simulating a third route based on the received sensor data and the failure of the second route, as is indicated in block 814.

Following this process, the computing device can provide the real-world vehicle with a route that enables safe navigation as determined via simulations. Further, the computing device could be configured to identify one or more portions of the route that involve performance of a navigation maneuver above a threshold difficulty level and only perform the simulation outlined in flowchart 800 on those portions that may cause difficulty. In some embodiments, the computing device could identify the one or more portions of the route that may cause difficulty based on map data, where the map data represents respective navigation maneuvers associated with navigation of the route. In other embodiments, the computing device could identify the one or more portions of the route that may cause difficulty based on one or more prior performances of at least a portion of the route by the vehicle. In still other embodiments, the computing device could identify the one or more portions of the route that may cause difficulty based on one or more prior performances of at least a portion of the route by one or more vehicles where the one or more vehicles have respective vehicle parameters that correspond to the set of vehicle parameters corresponding to the vehicle.

The computing device could also be configured to create and modify map data to indicate that the virtual vehicle navigated one or more portions of the route on the map below the threshold success level, and this information can be stored by the computing device as an indication of the modified route in the map data. The actual vehicle may utilize this stored map data to determine successive routes at a later time. Therefore, when the one or more portions of the route that previously have been indicated as difficult for the actual vehicle because the virtual vehicle performed below the threshold success level, this indication subsequently can be included in future routing instructions for the actual vehicle. The computing device might then be configured to modify the routing instructions such that navigation of the route avoids the one or more portions of the route that the virtual vehicle navigated below the threshold success level.

Figure 9:
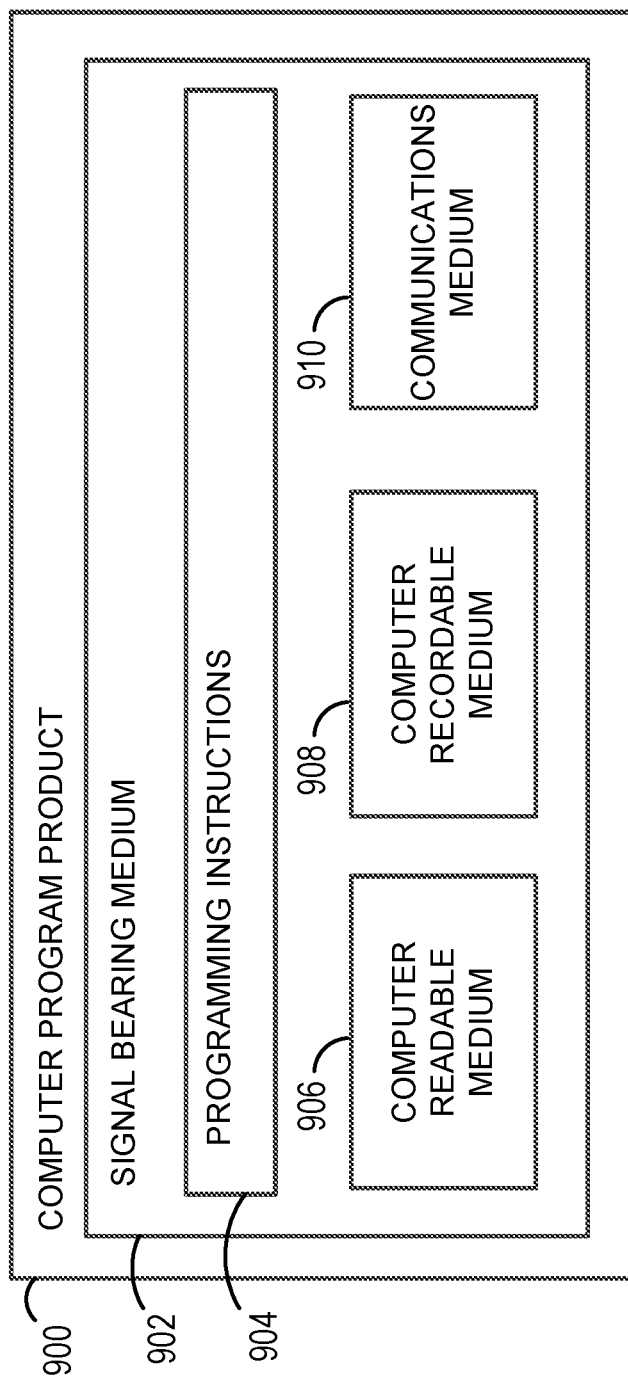
FIG. 9 is a schematic diagram of a computer program, according to one or more example embodiments.

FIG. 9 is a schematic illustrating a conceptual partial view of an example computer program product that includes a computer program for executing a computer process on a computing device, arranged according to at least some embodiments presented herein. In some embodiments, the disclosed methods may be implemented as computer program instructions encoded on a non-transitory computer-readable storage media in a machine-readable format, or on other non-transitory media or articles of manufacture.

Example computer program product 900 may be provided using signal bearing medium 902, which may include one or more programming instructions 904 that, when executed by one or more processors may provide functionality or portions of the functionality described above with respect to FIGS. 1-8. In some examples, the signal bearing medium 902 may encompass non-transitory computer-readable medium 906, such as, but not limited to, a hard disk drive, a Compact Disc (CD), a Digital Video Disk (DVD), a digital tape, memory, etc. In some implementations, the signal bearing medium 902 may encompass a computer recordable medium 908, such as, but not limited to, memory, read/write (R/W) CDs, R/W DVDs, etc. In some implementations, the signal bearing medium 902 may encompass a communications medium 910, such as, but not limited to, a digital and/or an analog communication medium (e.g., a fiber optic cable, a waveguide, a wired communications link, a wireless communication link, etc.). Thus, for example, the signal bearing medium 902 may be conveyed by a wireless form of the communications medium 910.

The one or more programming instructions 904 may be, for example, computer executable and/or logic implemented instructions. In some examples, a computing device such as the computer system 112 of FIG. 1 may be configured to provide various operations, functions, or actions in response to the programming instructions 904 conveyed to the computer system 112 by one or more of the computer readable medium 906, the computer recordable medium 908, and/or the communications medium 910.

The non-transitory computer readable medium could also be distributed among multiple data storage elements, which could be remotely located from each other. The computing device that executes some or all of the stored instructions could be a vehicle, such as vehicle 200 illustrated in FIG. 2A-2D, among other possibilities. Alternatively, the computing device that executes some or all of the stored instructions could be another computing device, such as a server.

The above detailed description describes various features and functions of the disclosed systems, devices, and methods with reference to the accompanying figures. While various aspects and embodiments have been disclosed herein, other aspects and embodiments will be apparent. The various aspects and embodiments disclosed herein are for purposes of illustration and are not intended to be limiting, with the true scope being indicated by the following claims.

It should be understood that arrangements described herein are for purposes of example only. As such, those skilled in the art will appreciate that other arrangements and other elements (e.g. machines, apparatuses, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

What is claimed is:

1. A method comprising:
obtaining, at a computing device, a first route to a destination for navigation by a vehicle and a set of vehicle parameters corresponding to the vehicle, wherein each vehicle parameter represents a physical attribute of the vehicle,
based on the set of vehicle parameters, generating a virtual vehicle that represents the vehicle;
performing, by the computing device, a first simulation that involves the virtual vehicle navigating the first route;
based on performing the first simulation, identifying one or more portions of the first route that the virtual vehicle navigated below a threshold success level;
responsive to identifying the one or more portions of the first route, modifying, by the computing device, map data to indicate that the virtual vehicle navigated the one or more portions of the first route below the threshold success level;
determining, by the computing device and using the map data, a second route to the destination that excludes the one or more portions of the first route;
performing, by the computing device, a second simulation that involves the virtual vehicle navigating the second route; and
based on performing the second simulation, providing, by the computing device, route instructions to the vehicle, wherein the vehicle is configured to autonomously navigate to the destination according to the route instructions.

2. The method of claim 1, further comprising:
identifying, by the computing device, one or more portions of the first route that involve performance of a navigation maneuver above a threshold difficulty level; and
wherein performing the first simulation that involves the virtual vehicle navigating the first route comprises:
performing the first simulation such that the virtual vehicle only navigates the one or more portions of the first route.

3. The method of claim 2, wherein identifying the one or more portions of the first route that involve performance of the navigation maneuver above the threshold difficulty level comprises:
identifying the one or more portions of the first route based on map data, wherein the map data represents respective navigation maneuvers associated with navigation of the first route.

4. The method of claim 2, wherein identifying the one or more portions of the first route that involve performance of the navigation maneuver above the threshold difficulty level comprises:
identifying the one or more portions of the first route based on one or more prior performances of at least a portion of the first route by the vehicle.

5. The method of claim 2, wherein identifying the one or more portions of the first route that involve performance of the navigation maneuver above the threshold difficulty level comprises:
identifying the one or more portions of the first route based on one or more prior performances of at least a portion of the first route by one or more vehicles, wherein the one or more vehicles have respective vehicle parameters that correspond to the set of vehicle parameters corresponding to the vehicle.

6. The method of claim 1, wherein the vehicle is configured to pull a trailer during navigation of the route, and wherein the set of vehicle parameters further comprises at least one vehicle parameter that represents a physical attribute of the trailer.

7. The method of claim 1, wherein obtaining the first route to the destination for navigation by the vehicle and the set of vehicle parameters corresponding to the vehicle comprises:
receiving, from the vehicle, the first route for navigation by the vehicle and the set of vehicle parameters corresponding to the vehicle, wherein the computing device is positioned remotely from the vehicle.

8. The method of claim 1, wherein the computing device is coupled to the vehicle, and wherein providing route instructions to the vehicle comprises:
controlling the vehicle based on the route instructions.

9. The method of claim 1, further comprising:
receiving weather information for areas corresponding to the first route to the destination for navigation by the vehicle, wherein the weather information depends on a time that the vehicle is scheduled to navigate the first route; and
wherein performing the first simulation that involves the virtual vehicle navigating the first route comprises:
performing the first simulation with the virtual vehicle navigating the first route in simulated weather conditions based on the weather information for the areas corresponding to the first route.

10. The method of claim 1, further comprising:
receiving traffic information for areas corresponding to the first route to the destination for navigation by the vehicle, wherein the traffic information depends on a time that the vehicle is scheduled to navigate the first route; and
wherein performing the first simulation that involves the virtual vehicle navigating the first route comprises:
performing the first simulation with the virtual vehicle navigating the first route in simulated traffic conditions based on the traffic information for the areas corresponding to the first route.

11. A system comprising:
a vehicle;
a computing device configured to:
obtain a first route to a destination for navigation by a vehicle and a set of vehicle parameters corresponding to the vehicle, wherein each vehicle parameter represents a physical attribute of the vehicle,
based on the set of vehicle parameters, generate a virtual vehicle that represents the vehicle;
perform a first simulation that involves the virtual vehicle navigating the first route;
based on performing the first simulation, identify one or more portions of the first route that the virtual vehicle navigated below a threshold success level;
responsive to identifying the one or more portions of the first route, modify map data to indicate that the virtual vehicle navigated the one or more portions of the first route below the threshold success level;
determine, using the map data, a second route to the destination that excludes the one or more portions of the first route;
perform a second simulation that involves the virtual vehicle navigating the second route; and
based on performing the second simulation, provide route instructions to the vehicle, wherein the vehicle is configured to autonomously navigate to the destination according to the route instructions.

12. The system of claim 11, wherein the vehicle is configured to pull a trailer during navigation of the route, and wherein the set of vehicle parameters indicate a height, a length, and a width of a combination of the vehicle and the trailer.

13. The system of claim 11, wherein the computing device is positioned remotely from the vehicle.

14. A non-transitory computer readable medium configured to store instructions, that when executed by a computing device, causes the computing device to perform operations comprising:
obtaining a first route to a destination for navigation by a vehicle and a set of vehicle parameters corresponding to the vehicle, wherein each vehicle parameter represents a physical attribute of the vehicle;
based on the set of vehicle parameters, generating a virtual vehicle that represents the vehicle;
performing a first simulation that involves the virtual vehicle navigating the first route;
based on performing the first simulation, identifying one or more portions of the first route that the virtual vehicle navigated below a threshold success level;
responsive to identifying the one or more portions of the first route, modifying map data to indicate that the virtual vehicle navigated the one or more portions of the first route below the threshold success level;
determining, using the map data, a second route to the destination that excludes the one or more portions of the first route;
performing, by the computing device, a second simulation that involves the virtual vehicle navigating the second route; and
based on performing the second simulation, providing route instructions to the vehicle, wherein the vehicle is configured to autonomously navigate to the destination according to the route instructions.

15. The method of claim 1, further comprising:
based on performing the second simulation, determining that the virtual vehicle navigated the second route above the threshold confidence level; and
wherein providing route instructions to the vehicle comprises:
providing route instructions that correspond to the second route.

16. The method of claim 1, further comprising:
determining that the virtual vehicle navigated the second route below the threshold confidence level when navigating the second route according to a first set of navigation parameters, wherein the first set of navigation parameters specifies first respective speeds for the vehicle during navigation of the second route;
modifying the first set of navigation parameters to generate a second set of navigation parameters, wherein the second set of navigation parameters comprises second respective speeds that differ from the first respective speeds;
performing a third simulation with the virtual vehicle navigating the second route according to the second set of navigation parameters; and
determining that the virtual vehicle navigated the second route above the threshold confidence level when navigating the second route according to the second set of navigation parameters.

17. The method of claim 1, wherein the set of vehicle parameters further indicate a type and a power rating for a motor of the vehicle; and
wherein generating the virtual vehicle that represents the vehicle comprises:
generating the virtual vehicle further based on the type and the power rating for the motor of the vehicle.

18. The method of claim 1, wherein the set of vehicle parameters further indicate a height, a length, a width, and a weight of a trailer being pulled by the vehicle when navigating to the destination; and
wherein generating the virtual vehicle that represents the vehicle comprises:
generating the virtual vehicle to include a virtual trailer based on the height, the length, the width, and the weight of the trailer being pulled by the vehicle.

19. The method of claim 1, further comprising:
performing a third simulation that involves the virtual vehicle navigating a third route to the destination;

determining that the virtual vehicle successfully navigated both the second route and the third route; and wherein providing route instructions to the vehicle comprises:

determining that a total trip time corresponding to the third route is less than a total trip time corresponding to the second route; and providing route instructions corresponding the third route to the vehicle.

20. The method of claim 1, further comprising:

performing a third simulation that involves the virtual vehicle navigating a third route to the destination;

determining that the virtual vehicle successfully navigated both the second route and the third route; and wherein providing route instructions to the vehicle comprises:

determining that the third route avoids toll roads that are part of the second route; and providing route instructions corresponding the third route to the vehicle.

* * * * *